(12) United States Patent
Ireland

(10) Patent No.: US 6,737,346 B2
(45) Date of Patent: May 18, 2004

(54) INTEGRATED CIRCUIT WITH MODIFIED METAL FEATURES AND METHOD OF FABRICATION THEREFOR

(75) Inventor: Philip J. Ireland, Nampa, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/231,390

(22) Filed: Aug. 29, 2002

(65) Prior Publication Data

US 2004/0041263 A1 Mar. 4, 2004

(51) Int. Cl.7 .......................................... H01L 21/4763
(52) U.S. Cl. ..................... 438/626; 438/689; 438/692; 438/584; 438/595
(58) Field of Search ........................ 438/689, 692, 438/595, 584

(56) References Cited

U.S. PATENT DOCUMENTS 5,965,940 A  * 10/1999  Juengling .................. 257/752
5,981,384 A     11/1999  Juengling .................. 438/666
6,627,549 B2 *  9/2003  Juengling .................. 438/689
6,638,867 B2 * 10/2003  Liu et al. .................. 438/692

* cited by examiner

Primary Examiner—David Nelms
Assistant Examiner—Mai-Huong Tran
(74) Attorney, Agent, or Firm—Schwegman, Lundberg, Woessner & Kluth, P.A.

(57) ABSTRACT

Embodiments of the invention concern modifying the layout of one or more metal layers of an integrated circuit before patterning those layers, so that an intermetal dielectric layer (IDL) subsequently deposited over the top surface of the patterned layer will be substantially self-planarized. The spacing between parallel edges of adjacent first metal lines and features is standardized, and one or more additional metal features are included in areas where an intersection exists. The additional metal features serve to maintain the elevation of the top surface of the IDL at the same height across the intersections, thus achieving self-planarization across the entire top surface of the IDL, without the need for a thicker than desired IDL. The modified metal layers are adapted for use in conjunction with memory cells and apparatus incorporating such memory cells, as well as other integrated circuits.

32 Claims, 16 Drawing Sheets

INTEGRATED CIRCUIT WITH MODIFIED METAL FEATURES AND METHOD OF FABRICATION THEREFOR

TECHNICAL FIELD

The present invention relates generally to design layout for metal layers of an integrated circuit, and more specifically to modifying the spacing between metal features that are diagonally-adjacent to one another, in order to better planarize the topology of a subsequently deposited dielectric layer over the metal features.

BACKGROUND

Conventionally designed metal line layouts of integrated circuits (IC) structures can result in large spaces between nearest parallel, electrically isolated metal lines. These spacings are random in size and have a great variety of dimensions. When an intermetal dielectric layer (IDL), such as an oxide, is deposited over the metal lines having random spacing between them, the top surface of the IDL will have a highest altitude equal to the thickness of the metal features ($T_{met}$) plus the thickness of the IDL ($T_{IDL}$) In those areas where there are no metal features but only open space, the altitude of the top surface of the IDL will be $T_{IDL}$.

FIG. 1 illustrates a side, cross-sectional view of a conventional integrated circuit structure, which includes a series of metal features 102 and an IDL 104 situated on a substrate 106. For example purposes, each metal line has a thickness, $T_{met}$ 110, and a width, $W_{met}$ 112. The thickness of IDL, $T_{IDL}$, is indicated at 114. The highest altitude of the top surface of IDL 104 is $T_{met}+T_{IDL}$, as indicated at 116.

FIG. 1 shows IDL 104 as being non-planarized and having both wide 132 and narrow trenches 130 in the top surface of IDL 104. Where the spacing between two metal features is small, a narrow trench 130 results. Where the spacing between metal features is larger, a wider trench 132 results. FIG. 1 also shows that the surface of IDL 104 is constant in large areas where no metal features exist, such as the right-hand side of FIG. 1, showing the top surface of IDL 104 to have an altitude of $T_{IDL}$, as indicated at 134. Accordingly, the prior art methods result in a nonplanar structure with heights of the IDL that vary between $T_{IDL}$ and $T_{met}+T_{IDL}$.

In order to flatten the top surface of the IDL so that subsequent metal layers can be deposited using photolithography equipment with a typical depth of focus, prior art processes then planarize the top surface of the IDL. For example, chemical mechanical polishing (CMP) techniques are commonly used to planarize the surface of an IDL.

Conventional processes often require a relatively thick IDL to guarantee an uninterrupted IDL film over the metal pattern after planarization is completed. For example, a typical IDL could have a thickness of about 12,000 angstroms when initially deposited. A planarization process would then be performed, which could remove about 7000 angstroms or more, resulting in an IDL with $T_{IDL}$ equal to about 5000 angstroms above the metal on average.

The conventional planarization process described above requires a relatively thick IDL layer to guarantee an uninterrupted IDL film over a metal pattern for electrical isolation. The process of depositing thick IDL layers is time consuming, and affects manufacturing yields. In addition, the planarization process itself is complicated and time consuming. The more IDL that must be removed during the planarization procedure, the longer it takes to process each wafer, resulting in lower manufacturing yields and higher costs. Accordingly, the prior art IDL planarization processes are expensive and are not as efficient as desired. In addition, the more IDL that is removed, the less consistent the thickness across the production line. This inconsistency reduces product quality as well as requiring other processing steps to cover the wider range of incoming oxide thickness (i.e., via etches, subsequent metal fills).

One might consider reducing the amount of IDL that is removed through planarization so that $T_{IDL}$ is greater over the metal features. However, when vias are formed through the IDL to interconnect with the metal features, these vias would have higher aspect ratios (i.e., the ratio of the vias height to its width) than if the IDL overlying the metal features were thinner. Via openings with high aspect ratios are more difficult to fill with conductive material, and thus are more likely to be defectively manufactured or prone to failure.

One method for improving on the IDL planarization process is disclosed by Werner Juengling in U.S. Pat. No. 5,981,384, issued Nov. 9, 1999. The method involves modifying the design of a metal layer's features to standardize the linear and diagonal spacing between nearest parallel and diagonal metal features. The design modifications yield a metal layer in which large open spaces are eliminated, and a relatively small, limited range of spaces, $S_{met}$, between nearest parallel metal features is achieved. The thickness of the IDL layer, $T_{IDL}$, is optimally chosen so that the trench between parallel metal features will be substantially filled with IDL material when it is deposited, thus eliminating the need for a subsequent planarization procedure. Essentially, using the method described by Juengling, the top surface of the IDL can be "self-planarized," meaning that the top surface is substantially flatter when IDL is deposited, even without a separate planarization step.

FIG. 2 illustrates a side, cross-sectional view of the metal line layout of FIG. 1 with enhanced metal features so as to standardize the spacing between the metal lines. As seen in FIG. 2, a substrate 206 has IDL 204 deposited over metal lines 202. Each metal line 202 changed width as compared to FIG. 1, by including additional features 210. These additional features 210 increase the resultant width of a metal line so that a standardized distance, $S_{met}$ 220, between nearest parallel metal lines and features is achieved. In addition, electrically isolated dummy features 222 are included where large areas of spacing existed on substrate 206, within which there were no metal lines 202. By standardizing the range of spaces $S_{met}$ 220, IDL 204 can be self-planarized at an altitude 224 of $T_{met}+T_{IDL}$, and only very narrow, "fused" trenches 230 remain. As long as $T_{IDL}$ is sufficiently great, these fused trenches 230 are insignificantly deep, eliminating other deeper trenches, and absent other deeper trenches 130, 132 or depressed areas 134 (FIG. 1). A subsequent planarization procedure is not necessary to achieve an acceptably planar surface of IDL 204, but a slight IDL buff can be used to achieve an even more flat surface. Such a buff can improve the smoothness of subsequent metal depositions, and result in lower resistance metal lines.

FIG. 3 illustrates a top-down view of a metal line layer of an IC having standardized spacing between nearest parallel and diagonal metal features in accordance with the Juengling method. Metal lines 302 exist on a substrate within an area bounded by a guard ring 304. Additional metal line features 310 have been added to existing metal lines 302 in order to standardize the spacing between nearest parallel and diagonal metal features. In addition, electrically isolated dummy features 322 have been added within the open space in which there are no metal lines.

Juengling states that the standard distance, $S_{met}$ 320, between nearest parallel metal features must be $\leq 2*T_{IDL}$. The reason for this is that most of the space between parallel metal features will be substantially filled with IDL material if $S_{met}$ is less than $2*T_{IDL}$, assuming perfect step coverage. Accordingly, even without a separate planarization process, only fused trenches (e.g., trench 230, FIG. 2) should exist on the top surface of the IDL between the parallel metal features. The optimum space, $S_{met}$, gets reduced for less than perfect step coverage IDL depositions. In addition, it is desirable to keep $T_{IDL}$ as low as possible so that vias that are subsequently formed through the IDL will not have an unreliably high aspect ratio.

Limitations of the Juengling method are apparent, however, in areas such as areas 350 and 370, where an "intersection" of spaces between metal features exists. FIG. 4 illustrates an enlarged, top-down view of area 350 of the metal line layout of FIG. 3, illustrating the effect on an IDL in an area where a four-way intersection of metal features 402, 404, 406, 408 exists.

As described previously, according to the Juengling method, the distance between parallel metal features (e.g., features 404, 406) is $S_{met}$ 410, which is optimally $\leq 2*T_{IDL}$. The distance between nearest diagonal features (e.g., features 402, 406) is $S_{metdrag}$ 420, which is approximately $\sqrt{2}*S_{met}$. When the constraint is used that $S_{met} \leq 2*T_{IDL}$, then $S_{metdrag}$ must be $\leq 2\sqrt{2}*T_{IDL}$. Dashed IDL contour lines 430 illustrate where the top surface of the IDL will start to droop when $S_{met}$ approximately equals $2*T_{IDL}$, where $T_{IDL}$ is indicated by reference number 440. Between parallel features (e.g., features 402, 404 or 406, 408), no significant droop will occur, and a fused trench akin to trench 230 (FIG. 2) will exist. However, between diagonal features (e.g., features 402, 406), a substantial droop will occur, and a depression, akin to trenches 130 or 132 (FIG. 1), will exist on the top surface of the IDL, as indicated by region 450. The altitude of the surface of the IDL within the depression 450 can approach $T_{IDL}$.

A similar phenomenon occurs in regions where two-way and three-way intersections exist. FIG. 5 illustrates an enlarged, top-down view of area 370 of the metal line layout of FIG. 3, illustrating the effect on an IDL in an area where a three-way intersection exists. Dashed IDL contour lines 530 illustrate where the top surface of the IDL will start to droop when $S_{met}$ 510 equals $2*T_{IDL}$, where $T_{IDL}$ is indicated by reference number 540 (again, for perfect step coverage). Between parallel features (e.g., features 502, 504 or 502, 506), no significant droop will occur, and a fused trench akin to trench 230 (FIG. 2) will exist. However, in the center of the intersection, a substantial droop will occur, and a depression, akin to trenches 130 or 132 (FIG. 1), will exist on the top surface of the IDL, as indicated by region 550.

These trenches 450, 550 (FIGS. 4, 5) present in regions with intersections or metal feature corners reduce the flatness of the top surface of the IDL. This necessitates using a thicker IDL layer in order to reduce or eliminate the depressions. A thicker IDL means that the aspect ratio of subsequently formed vias will be higher, unless a separate planarization procedure is used to reduce the IDL thickness. Both a thicker IDL and a separate planarization procedure add cost and complexity to the manufacturing process, as well as reducing yields.

Manipulation of the governing equations further clarifies the issues. In order to achieve self-planarization between parallel metal features, then $T_{IDL} \geq 0.5*S_{met}$ (because $S_{met} \leq 2*T_{IDL}$). However, in order to achieve self-planarization between diagonal metal features, then $T_{IDL} \geq 0.5*S_{metdrag}$. According to this constraint, and since $S_{metdrag} \approx \sqrt{2}*S_{met}$, then in order to achieve complete self-planarization, $T_{IDL} \geq 0.5*(\sqrt{2}*S_{met})$, or $T_{IDL} \geq (\sqrt{2}/2)*S_{met}$.

In other words, the Juengling method will result in a self-planarized IDL for $0.5*S_{met} \leq T_{IDL} \leq (\sqrt{2}/2)*S_{met}$ when only parallel metal features exist. However, $T_{IDL}$ must be $\geq (\sqrt{2}/2)*S_{met}$ to achieve a fully self-planarized IDL, when the metal layer includes intersections. Therefore, when the metal layer includes such intersections, the IDL must be made thicker and the aspect ratio of subsequently formed vias will be higher, absent a separate planarization procedure.

Accordingly, what are needed are metal feature designs and manufacturing methods where the top surface of an IDL is self-planarized, even in regions where intersections exist. Further needed are metal feature designs and manufacturing methods that achieve this self-planarization using an IDL that is as thin as possible, so that the aspect ratio of subsequently formed vias is as low as possible.

SUMMARY

Embodiments of the present invention provide a metal feature structure that eliminates the need for a separate planarization procedure or a thicker IDL. In addition, embodiments provide a method for fabricating the structure on an integrated circuit, such as a dynamic random access memory (DRAM).

For one embodiment, the invention provides a method for fabricating an integrated circuit structure. The method includes depositing a conductive layer above an insulating material, and patterning the conductive layer to form a plurality of first metal features and at least one second metal feature. The first metal features and the at least one second metal feature have a substantially equal thickness, $T_{met}$, above the insulating material, and the first metal features have a substantially standard distance, $S_{met}$, between parallel edges of adjacent ones of the first metal features. The at least one second metal feature is connected to one or more of the first metal features in proximity to an intersection area of the conductive layer. An intersection area is a roughly rectangular area that includes at least one metal feature corner, parts of at least one other metal feature that are in close proximity to the at least one metal feature corner, and a portion of a dielectric layer that will be located between the at least one metal feature corner and the parts of the at least one other metal feature. The method also includes depositing the dielectric layer having a thickness, $T_{IDL}$, over the conductive layer.

For another embodiment, the method includes forming a portion of a semiconductor device, which includes a layer of insulating material that defines a top surface of the portion of the semiconductor device, depositing a conductive layer above the layer of insulating material, and patterning the conductive layer to form a plurality of first metal features and at least one second metal feature. The first metal features and the at least one second metal feature have a substantially equal thickness, $T_{met}$, above the insulating material, and the first metal features have a substantially standard distance, $S_{met}$, between parallel edges of adjacent ones of the first metal features. The at least one second metal feature is connected to one or more of the first metal features in proximity to an intersection area of the conductive layer. An intersection area is a roughly rectangular area that includes at least one metal feature corner, parts of at least one other metal feature that are in close proximity to the at least one metal feature corner, and a portion of a dielectric layer that will be located between the at least one metal feature corner and the parts of the at least one other metal feature. The method further includes depositing the dielectric layer having a thickness, $T_{IDL}$, over the conductive layer.

For yet another embodiment, the method includes depositing a conductive layer above an insulating material, and patterning the conductive layer to form a plurality of first metal features and at least one second metal feature. The first metal features and the at least one second metal feature have a substantially equal thickness, $T_{met}$, above the insulating material, and the first metal features have a substantially standard distance, $S_{met}$, between parallel edges of adjacent ones of the first metal features. The at least one second metal feature is connected to one or more of the first metal features in proximity to an intersection area of the conductive layer. An intersection area is a roughly rectangular area that includes at least one metal feature corner, parts of at least one other metal feature that are in close proximity to the at least one metal feature corner, and a portion of a dielectric layer that will be located between the at least one metal feature corner and the parts of the at least one other metal feature. The intersection area includes the parts of the at least one other metal feature that are within a distance of roughly $\sqrt{2}*S_{met}$ from the at least one metal feature corner. The method further includes depositing the dielectric layer having a thickness, $T_{IDL}$, over the conductive layer.

For a further embodiment, the method includes depositing a conductive layer above an insulating material, and patterning the conductive layer to form a plurality of first metal features and at least one second metal feature. The first metal features and the at least one second metal feature have a substantially equal thickness, $T_{met}$, above the insulating material, and the first metal features have a substantially standard distance, $S_{met}$, between parallel edges of adjacent ones of the first metal features. The at least one second metal feature is connected to one or more of the first metal features in proximity to an intersection area of the conductive layer. An intersection area is a roughly rectangular area that includes at least one metal feature corner, parts of at least one other metal feature that are in close proximity to the at least one metal feature corner, and a portion of a dielectric layer that will be located between the at least one metal feature corner and the parts of the at least one other metal feature. The method further includes depositing the dielectric layer over the conductive layer, where the dielectric layer has a thickness, $T_{IDL}$, where $0.5*S_{met} \leq T_{IDL} \leq (\sqrt{2}/2)*S_{met}$.

Further embodiments of the invention include semiconductor structures produced using one or more methods of the invention, as well as apparatus, devices, modules and systems making use of such semiconductor structures.

Because they reduce the need for thicker IDLs and separate planarization procedures, embodiments of the present invention reduce the cost and enhance the yield of current integrated circuit designs. Further features and advantages of the present invention, as well as the structure and operation of various embodiments, are described in detail below with reference to the accompanying drawings.

DESCRIPTION OF THE EMBODIMENTS

Figure 1:
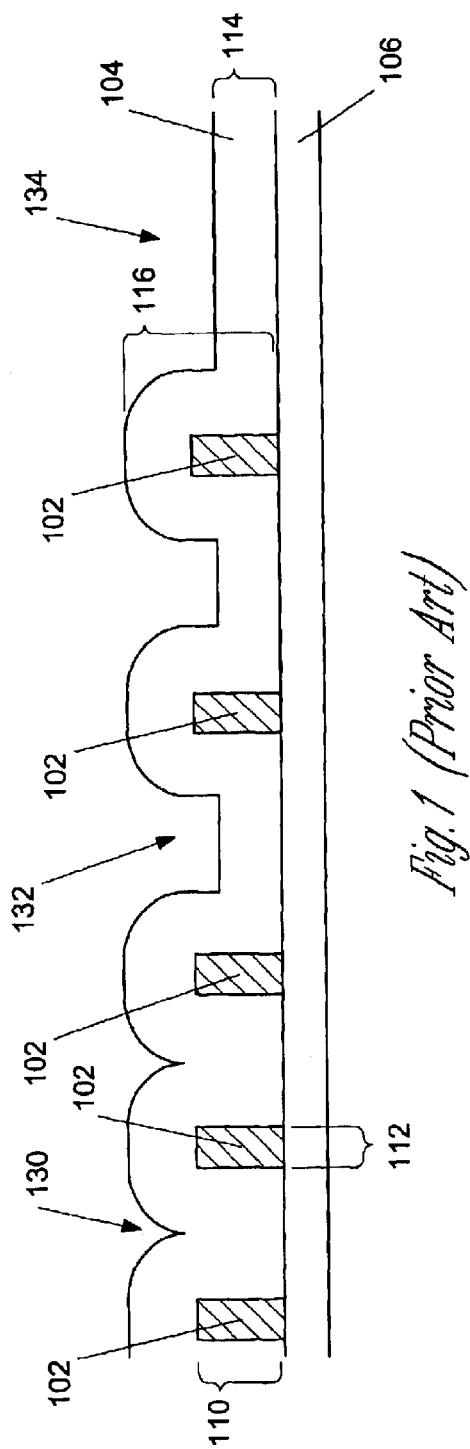
FIG. 1 illustrates a side, cross-sectional view of a conventional integrated circuit structure, which includes a series of metal lines and an IDL situated on a substrate.

In the following detailed description of the preferred embodiments, reference is made to the accompanying drawings which form a part hereof, and in which is shown by way of illustration specific embodiments in which the inventions may be practiced. These embodiments are described in sufficient detail to enable those skilled in the art to practice the invention, and it is to be understood that other embodiments may be utilized and that process or mechanical changes may be made without departing from the scope of the present invention. It will be recognized that the methods of the various embodiments can be combined in practice, either concurrently or in succession. Various permutations and combinations will be readily apparent to those skilled in the art.

Terminology

The terms "wafer" and "substrate" used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor, as well as other semiconductor support structures that are new or are well known to one skilled in the art. Furthermore, when reference is made to a wafer or substrate in the following description, previous process steps may have been utilized to form regions/junctions in the base semiconductor structure.

The terms "horizontal" and "vertical" are used to explain the relative orientations of particular views. For the purposes of this description, assuming a semiconductor wafer or device is laid flat along a horizontal plane, a "top-down" or "horizontal" view of the device indicates a view of the device from above. Conversely, a "side" or "vertical" view of the device indicates a view of the device from the side. In the figures, any cut-away view is referred to as a "cross-sectional" view. An "elevational" view is a view of an exterior surface.

The term "intersection" is used herein to indicate a roughly rectangular (i.e., square or rectangular) area that includes a first metal feature corner, parts of at least one other metal feature that are in close proximity to the first metal feature corner (e.g., other corners and/or straight edges), and a space between the first metal feature corner and the parts of the other metal features. The term "street" is used herein to refer to a space between parallel metal features. Therefore, the term "intersection" can also be understood to mean an intersection of "streets." In one embodiment, the intersection area includes the first metal feature corner, and parts of at least one other metal features that are within a distance of roughly $\sqrt{2}*S_{met}$ from the first metal feature corner. These intersections can be two-way (650, FIG. 6), three-way (630, FIG. 6), four-way (640, FIG. 6) or more.

Modified Metal Features

In accordance with embodiments of the invention, additional metal features are included within regions of a metal layer that have an intersection. By including these additional metal features, depressions in the top surface of the IDL are substantially reduced, even without using a thicker IDL or separate planarization procedure. Accordingly, the embodiments of the invention result in a self-planarized IDL using minimal IDL materials and no separate planarization procedure.

Figure 3:
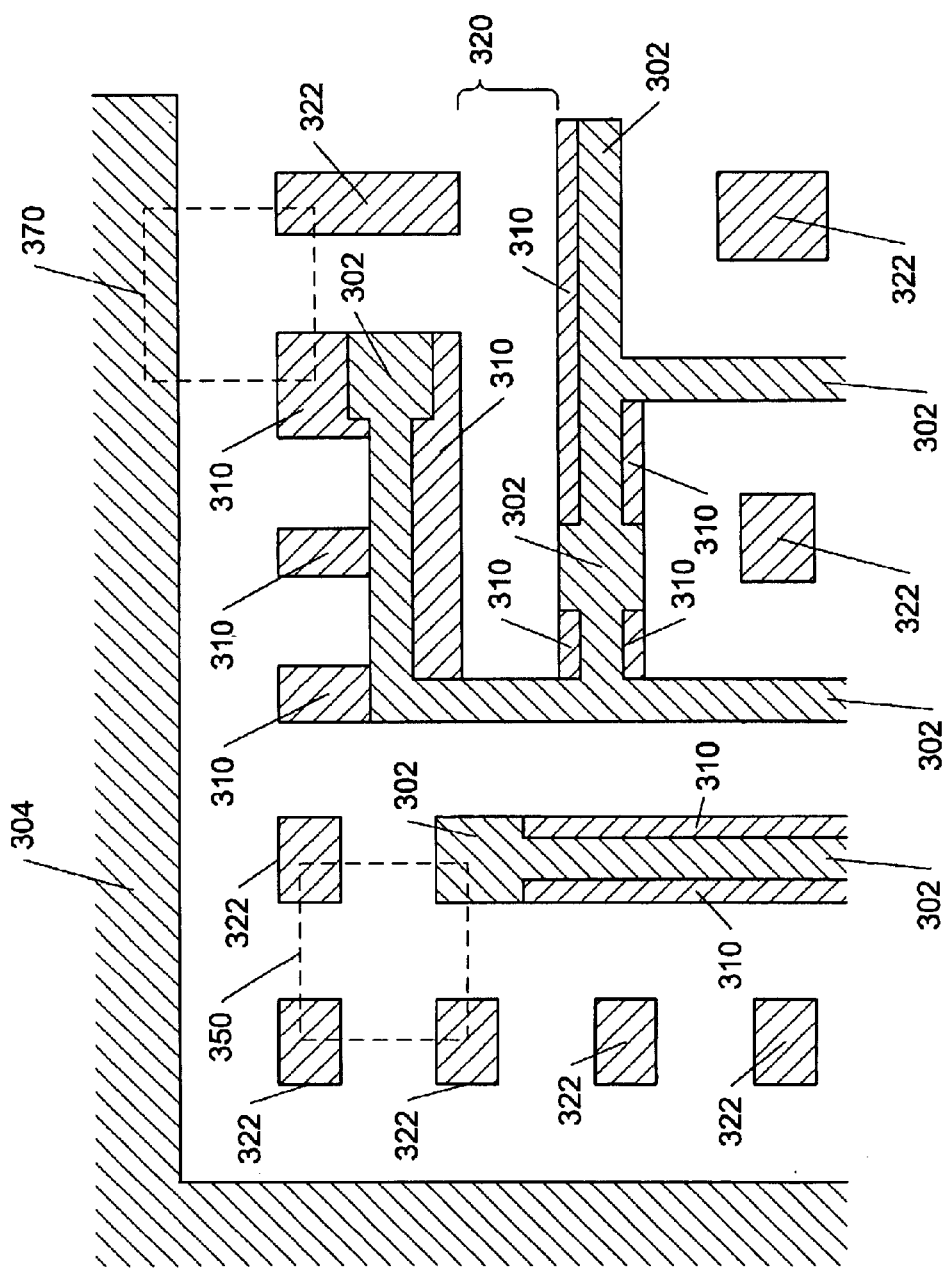
FIG. 3 illustrates a top-down view of a metal line layer of an IC having standardized spacing between nearest parallel metal features.

Advantages of the embodiments described below are most fully realized when a metal line layout has been designed with a standardized range of spacings between nearest parallel and diagonal metal features, except in those areas where the metal features are modified in accordance with embodiments of the invention. For ease of description of the present invention, metal features included for the purpose of standardizing the distances between nearest parallel and diagonal metal features are not differentiated from the originally-designed metal features, as is done in FIG. 3, for example, where metal lines 302 are differentiated from additional metal features 310 and dummy metal features 322. Instead, only those additional metal features that function to better planarize an IDL in regions that include an intersection are differentiated in the figures that follow.

Figure 6:
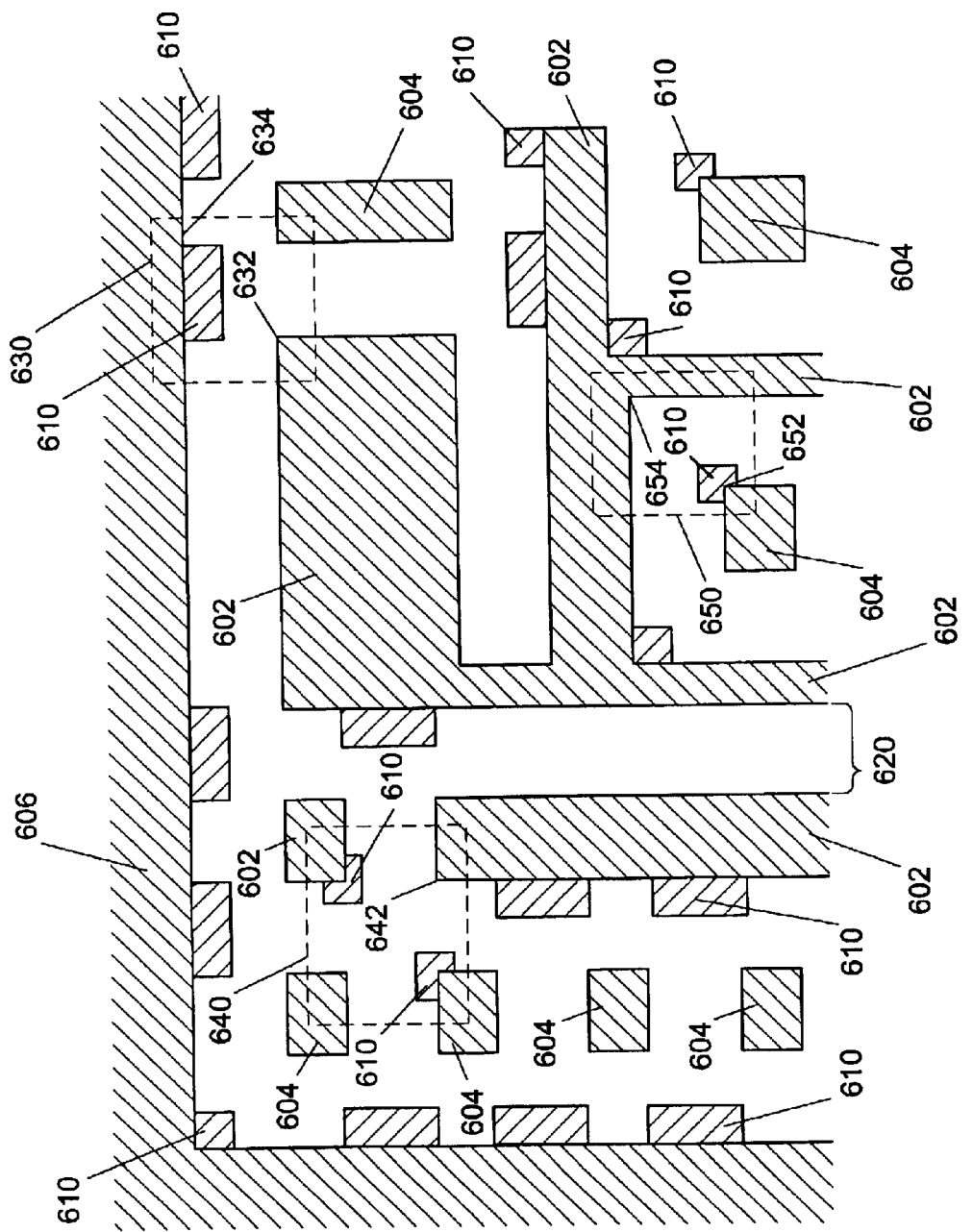
FIG. 6 illustrates a top-down view of a metal line layer of an IC having additional metal features in areas with intersections, in accordance with an embodiment of the invention.

FIG. 6 illustrates a top-down view of a metal layer of an IC having additional metal features 610 in areas where intersections exist, in accordance with an embodiment of the invention. A plurality of electrically unisolated metal lines 602 and electrically isolated metal features 604 exist on a substrate within an area bounded by a guard ring 606. Typically, at least three of the electrically unisolated metal lines 602 are substantially parallel. In accordance with an embodiment of the invention, additional metal line features 610 have been added to existing metal lines 602, metal features 604, and guard ring 606 in order to reduce the depth of depressions in the top surface of a subsequently deposited IDL in areas where an intersection exists.

In one embodiment, the metal layer has a substantially standard distance, $S_{met}$ 620, between parallel edges of adjacent metal features 602, 604, except in areas (e.g., areas 630, 640, 650) where the inter-feature distance is modified by the additional metal features 610. In accordance with an embodiment of the invention, electrically isolated metal features 604 function to provide the substantially standard distance, $S_{met}$, between the parallel edges of metal features 602, 604.

The standard distance, $S_{met}$ 620, between nearest parallel metal features is optimally $\leq 2*T_{IDL}$, or $T_{IDL} \geq 0.5*S_{met}$. The reason for this is that the space between parallel metal features will be substantially filled with IDL material, and even without a subsequent planarization process, only fused trenches (e.g., trench 1230, FIG. 12) will exist on the top surface of the IDL between parallel metal features.

Figure 4:
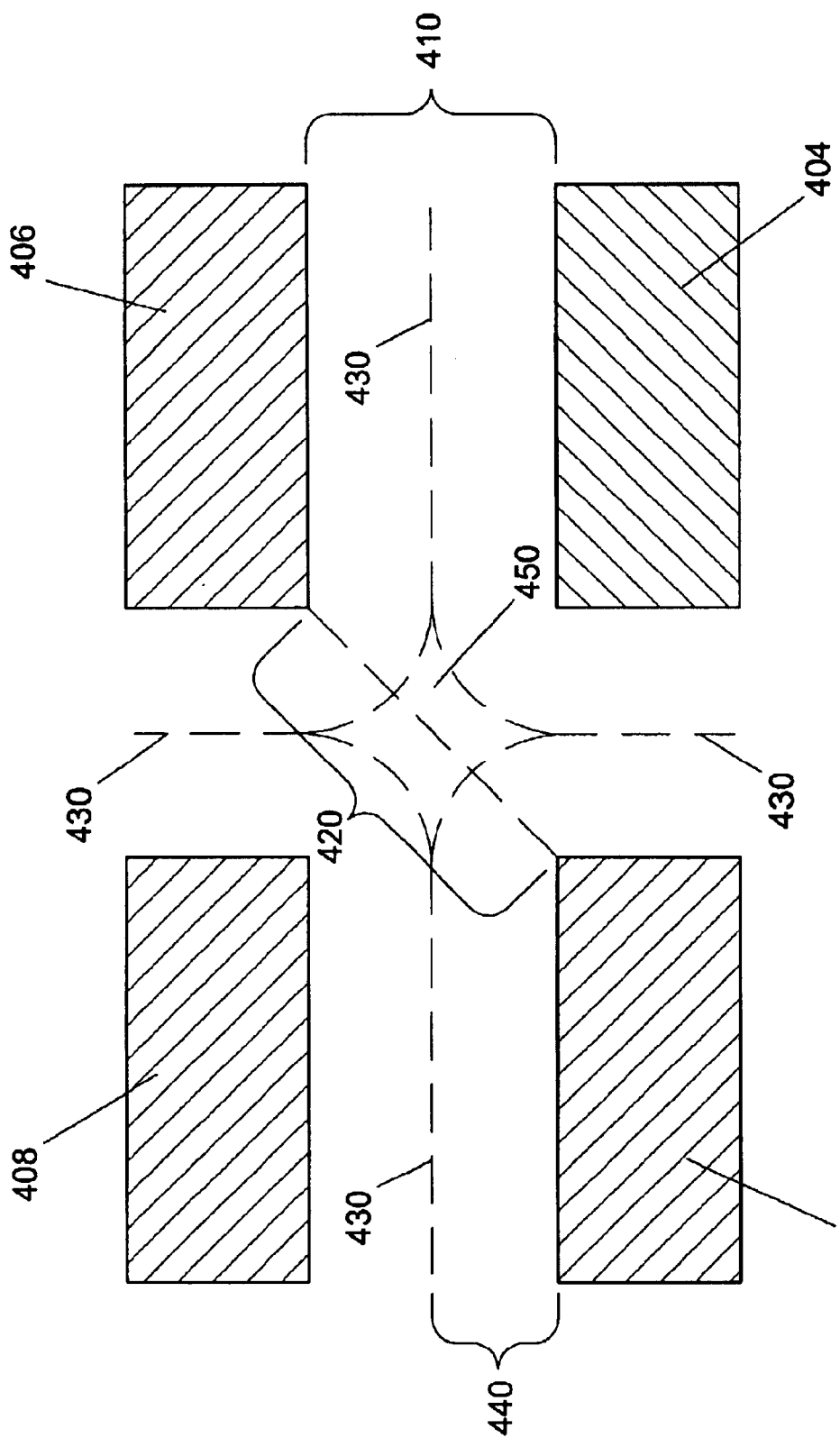
FIG. 4 illustrates an enlarged, top-down view of an area of the metal line layout of FIG. 3, illustrating the effect on an IDL in an area where a four-way intersection exists.
Figure 5:
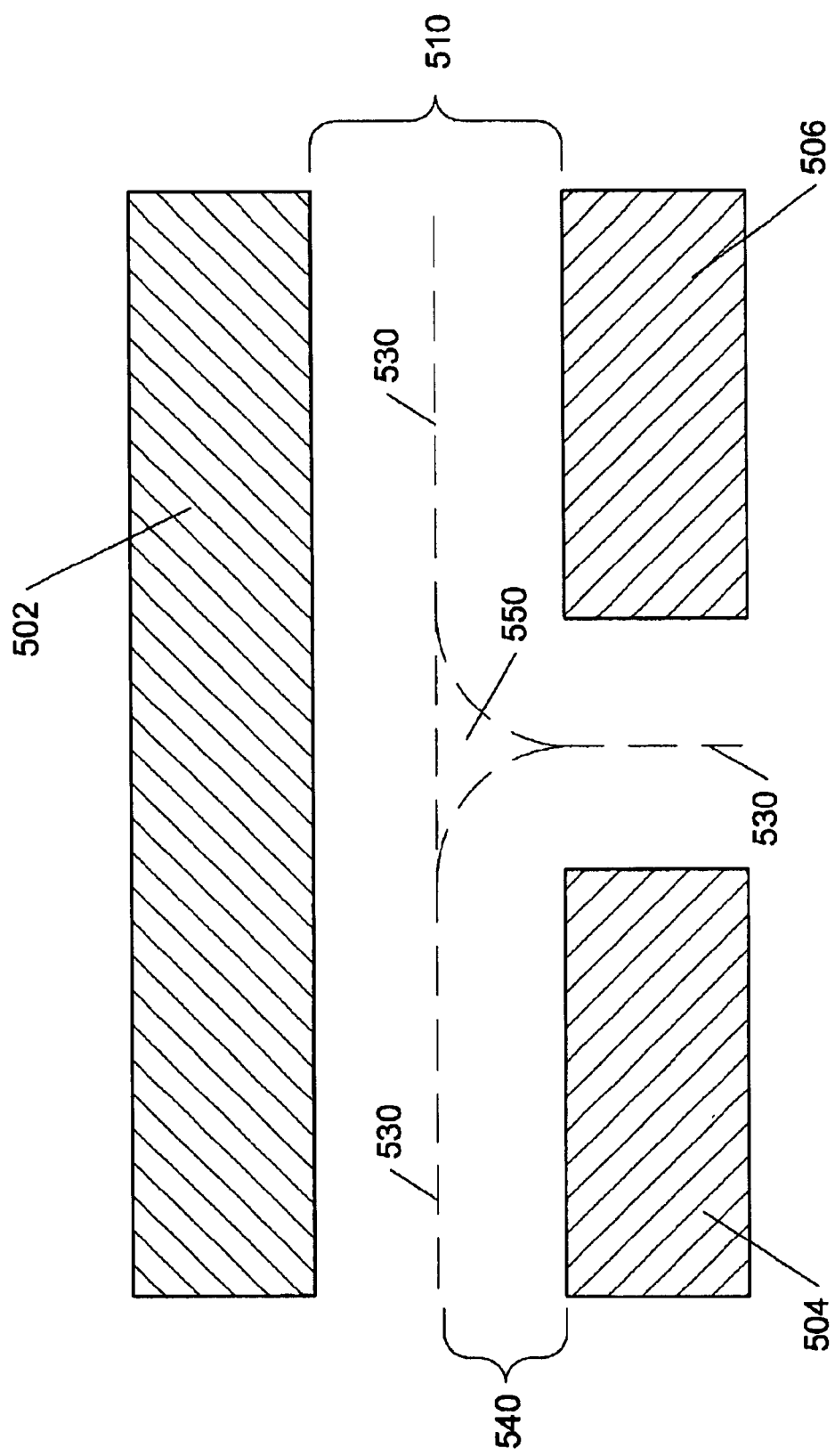
FIG. 5 illustrates an enlarged, top-down view of an area of the metal line layout of FIG. 3, illustrating the effect on an IDL in an area where a three-way intersection exists.

However, without additional metal features 610, depressions (e.g., depressions 450, 550, FIGS. 4, 5) would exist on the top surface of the IDL in areas where an intersection exists. Additional metal features 610 serve to maintain the altitude of a portion of the IDL that overlies an intersection to roughly $T_{met}+T_{IDL}$, where the altitude is the height of the IDL above the insulating material underlying the metal layer. Thus, the additional metal features maintain the altitude within the areas where depressions otherwise would occur, as will be more fully described and illustrated in conjunction with FIGS. 7–10.

The distance between an additional metal feature 610 and at least one other feature is less than $S_{met}$, in one embodiment. Accordingly, using embodiments of the invention, $0.5*S_{met} \leq T_{IDL} \leq (\sqrt{2}/2)*S_{met}$, without encountering significant droops in the IDL layer overlying areas where an intersection exits. When the additional metal features 610 are sufficiently large, then $T_{IDL}$ can approximately equal $0.5*S_{met}$ without encountering significant droops. Thus, in one embodiment, $T_{IDL}$ roughly equals $0.5*S_{met}$. In another embodiment, $0.5*S_{met} \leq T_{IDL} \leq 0.6*S_{met}$. In still another embodiment, $0.6*S_{met} < T_{IDL} < 0.7*S_{met}$. In other embodiments, $T_{IDL} \geq (\sqrt{2}/2)*S_{met}$.

In one embodiment, the size and location of the additional metal features 610 is chosen so that $S_{metdrag} \leq S_{met}$. If small depressions in the top surface of the IDL are tolerable, than $S_{metdrag}$ can be slightly larger than $S_{met}$, in other embodiments.

Deep trenches such as trenches 450, 550 (FIGS. 4, 5) present in regions with intersections are substantially eliminated using embodiments of the invention, and neither a thicker IDL nor a separate planarization procedure (e.g., CMP) are required to self-planarize the IDL or to reduce the aspect ratio of subsequently formed vias. Use of embodiments of the invention thus reduce the cost and complexity of the manufacturing process, as well as increasing yields.

As described previously, an intersection can be two-way, three-way, four-way or more. Area 650 represents a two-way intersection, which includes one metal feature corner 652 and a metal feature with an inverted corner 654. Area 630 represents a three-way intersection, which includes two metal feature corners 632 and a metal feature with a straight edge 634 through the intersection area. Area 640 represents a four-way intersection, which includes four metal feature corners 642. In various embodiments, additional metal features 610 are connected in proximity to one or more of the corners. In the case of a two-way intersection 650, a metal feature can also or alternatively be connected in proximity to the inverted corner 654, in one embodiment.

Figure 7:
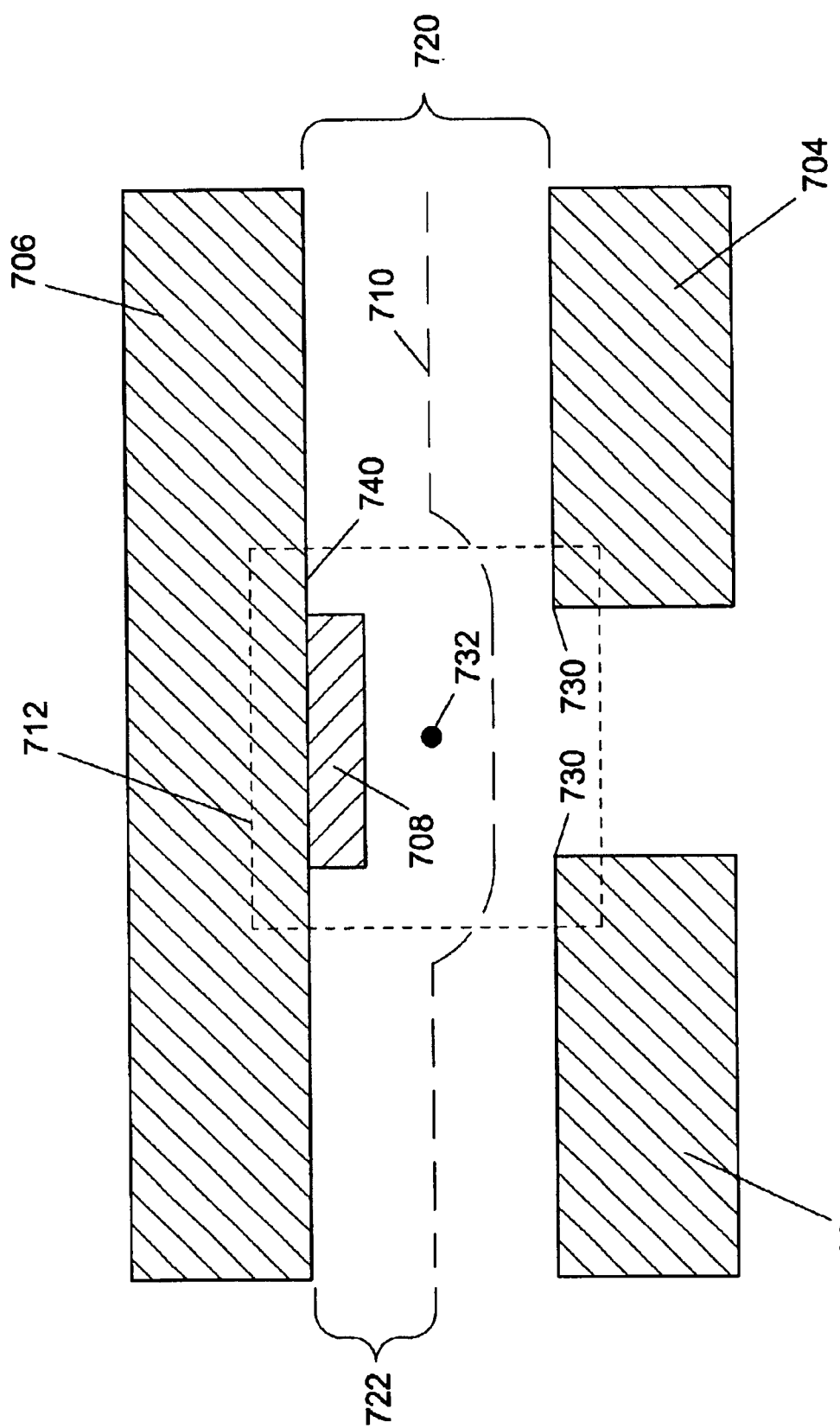
FIG. 7 illustrates an enlarged, top-down view of an area of the metal line layout of FIG. 6, where a three-way intersection exists, in accordance with an embodiment of the invention.

FIG. 7 illustrates an enlarged, top-down view of area 630 of the metal line layout of FIG. 6, where a three-way intersection 712 of metal features 702, 704, 706 exists, in accordance with an embodiment of the invention. Intersection 712 includes two corners 730 and a portion of a straight edge 740 of metal feature 706. An additional metal feature 708 has been added to a straight edge of metal feature 706, in accordance with an embodiment of the invention. The additional metal feature 708 is positioned so as to extend the highest altitude of the top surface of the IDL into the area where a substantial depression (e.g., depression 550, FIG. 5) would occur if feature 708 were not present.

Figure 2:
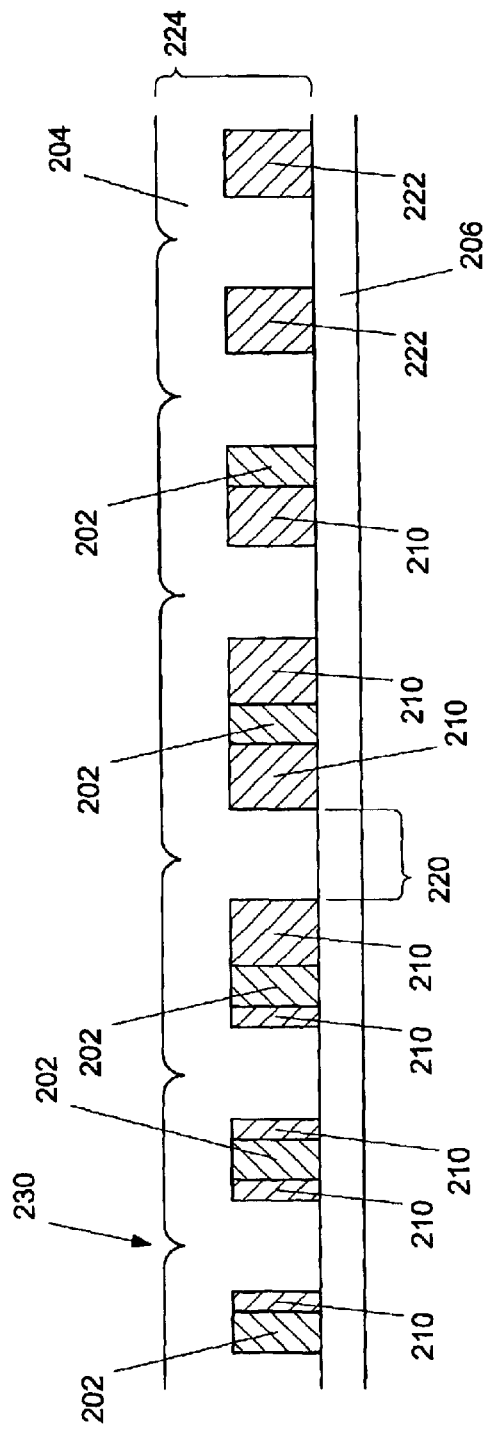
FIG. 2 illustrates a side, cross-sectional view of the metal line layout of FIG. 1 with enhanced metal features so as to standardize the spacing (i.e., create a narrow range of spaces) between the metal lines.

Dashed IDL contour line 710 illustrates where the IDL that overlies features 706 and 708 would start to droop when $S_{met}$ 720 roughly equals $2*T_{IDL}$, where $T_{IDL}$ is indicated by reference number 722. Between parallel features (e.g., features 702, 706 or 704, 706), no significant droop will occur, and a fused trench akin to trench 230 (FIG. 2) will exist. In addition, in the center 732 of intersection 712, the droop is substantially reduced. Instead, the top surface of the IDL is substantially flat across the intersection 712 or a fused trench exists.

In the embodiment shown in FIG. 7, the additional metal feature 708 is connected to a substantially straight side 740 of metal feature 706 and extends toward the center 732 of the intersection. In other embodiments, additional metal features could be positioned in other locations, while still substantially increasing the flatness of the IDL in the area of an intersection, as will be illustrated in FIG. 8.

Figure 8:
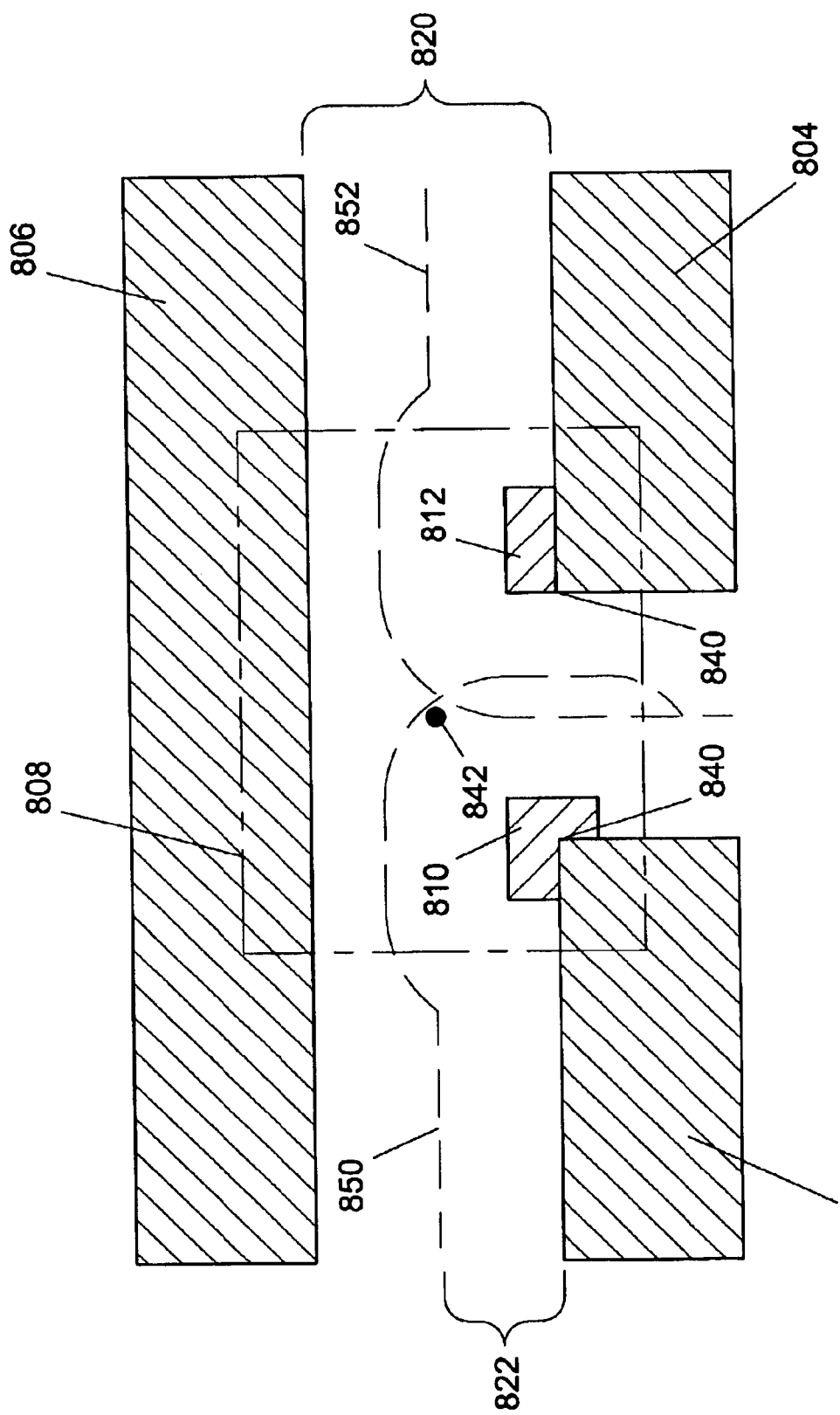
FIG. 8 illustrates an enlarged, top-down view of an area of a metal line layout where a three-way intersection exists, in accordance with another embodiment of the invention.

FIG. 8 illustrates an enlarged, top-down view of a metal line layout where a three-way intersection 808 of metal features 802, 804, 806 exists, in accordance with another embodiment of the invention. Additional metal features 810, 812 have been added to metal features 802, 804, respectively, in accordance with an embodiment of the invention. The additional metal features 810, 812 are positioned so as to extend the highest altitude of the top surface of the IDL into the area where a substantial depression (e.g., depression 550, FIG. 5) would occur if features 810, 812 were not present.

Dashed IDL contour line 850 illustrates where the IDL that overlies features 802 and 810 would start to droop when $S_{met}$ 820 roughly equals $2*T_{IDL}$, where $T_{IDL}$ is indicated by reference number 822. In addition, dashed IDL contour line 852 illustrates where the IDL that overlies features 804 and 812 would start to droop. Between parallel features (e.g., features 802, 806 or 804, 806), no significant droop will occur, and a fused trench akin to trench 230 (FIG. 2) will exist. In addition, in the center 842 of the intersection 808, no substantial droop will occur as it would with prior art metal line layouts. Instead, the top surface of the IDL is substantially flat across intersection 808 or a fused trench exists.

In the embodiment shown in FIG. 8, the additional metal features 810, 812 are connected in proximity to corners 840 of metal features 802, 804, and they extend toward the center 842 of the intersection. Metal feature 810 connects to two perpendicular, intersecting sides of corner 840, and metal feature 812 connects only to one side of corner 840. In various embodiments, additional metal features could be positioned in conjunction with one or more corners of an intersection and/or along a metal feature's straight edge (e.g., edge 740, FIG. 7) within an intersection. One, two, three, four or more additional metal features could be present within an intersection in order to flatten the top surface of the IDL.

FIGS. 7 and 8 illustrated embodiments of the invention where additional metal features were added in an area that includes a three-way intersection. In other embodiments, additional metal features can be added in an area that includes a four-way intersection.

Figure 9:
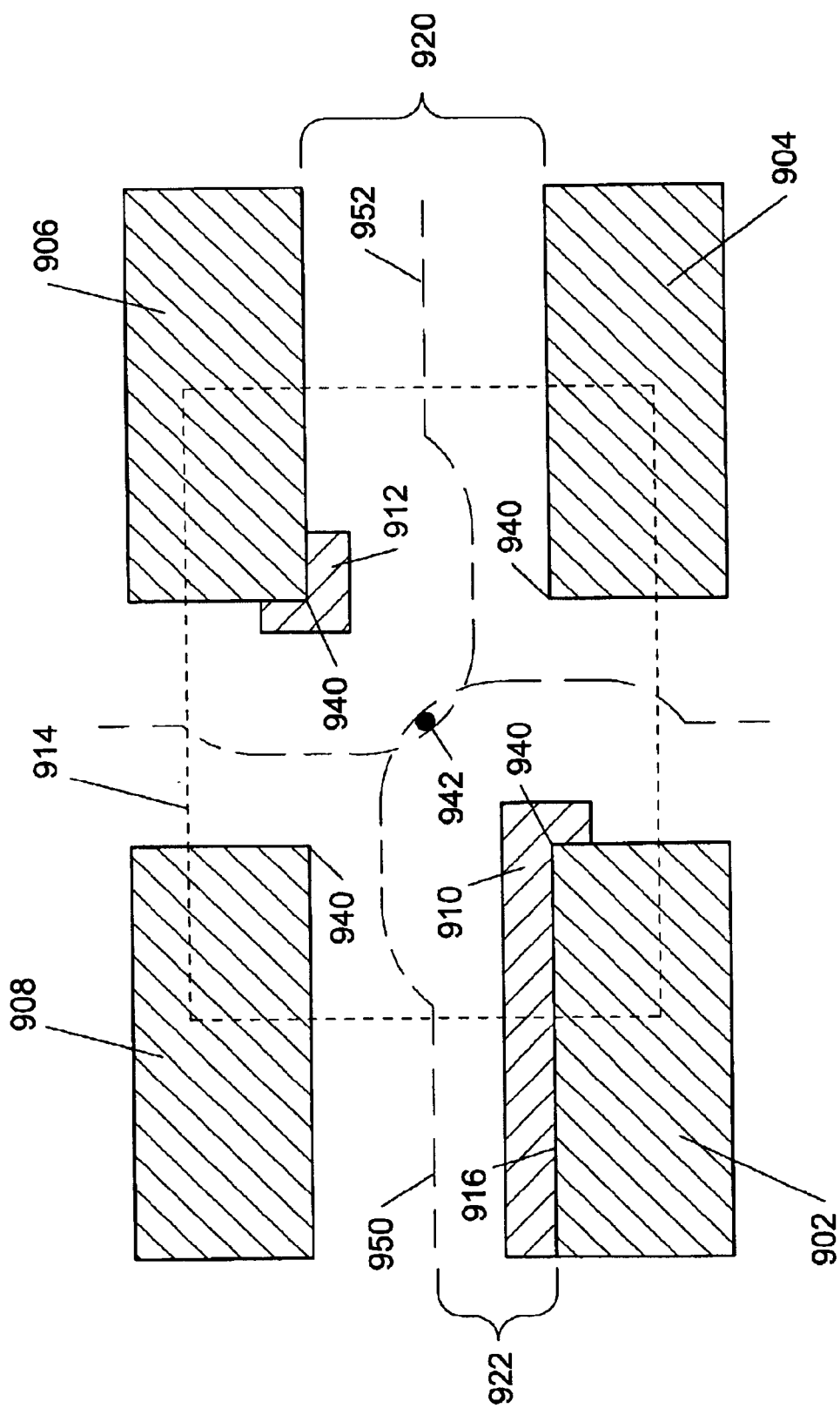
FIG. 9 illustrates an enlarged, top-down view of an area of the metal line layout of FIG. 6, where a four-way intersection exists, in accordance with an embodiment of the invention.

FIG. 9 illustrates an enlarged, top-down view of area 640 of the metal line layout of FIG. 6, where a four-way intersection 914 of metal features 902, 904, 906, 908 exists, in accordance with an embodiment of the invention. Intersection 914 includes four corners 940 of the four metal features 902, 904, 906, 908. Additional metal features 910, 912 have been added to metal features 902, 906, respectively, in accordance with an embodiment of the invention. The additional metal features 910, 912 are positioned so as to extend the highest altitude of the top surface of the IDL into the area where a substantial depression (e.g., depression 450, FIG. 4) would occur if features 910, 912 were not present.

Dashed IDL contour line 950 illustrates where the IDL that overlies features 902 and 910 would start to droop when $S_{met}$ 920 roughly equals $2*T_{IDL}$, where $T_{IDL}$ is indicated by reference number 922. In addition, dashed IDL contour line 952 illustrates where the IDL that overlies features 906 and 912 would start to droop. Between parallel features (e.g., features 902, 908 or 904, 906), a less significant droop will occur, and a fused trench akin to trench 230 (FIG. 2) will exist. In addition, in the center 942 of intersection 914, no substantial droop will occur as it would with prior art metal line layouts. Instead, the top surface of the IDL is substantially flat across the intersection 914 or a fused trench exists.

In the embodiment shown in FIG. 9, the additional metal features 910, 912 are connected in proximity to corners 940 of metal features 902 and 906, and they extend toward the center 942 of the intersection. Both metal features 910, 912 connect to two perpendicular, intersecting sides of corners 940. In an alternate embodiment, one or more metal features could connect only to one side of a corner 940. Metal features 910, 912 can be relatively small, such as feature 912, which exists entirely in close proximity to the corner 940 of feature 906, or they can be relatively larger, such as feature 910, which extends along an edge 916 of feature 902.

In various embodiments, metal features could be positioned in conjunction with one or more corners of an intersection. One, two, three, four or more metal features could be present within an intersection in order to flatten the top surface of the IDL. For example, where FIG. 9 illustrates additional metal features associated with two corners 940, in alternate embodiments, only a single metal feature could be associated with a single corner 940, or additional metal features could be associated with three or four of the corners 940.

In still another embodiment, the depressions that would inherently exist in intersections are eliminated by modifying the features of a metal layer in two ways: 1) by shifting the metal features associated with a four-way intersection; and 2) by including additional metal features, as was described previously.

Figure 10:
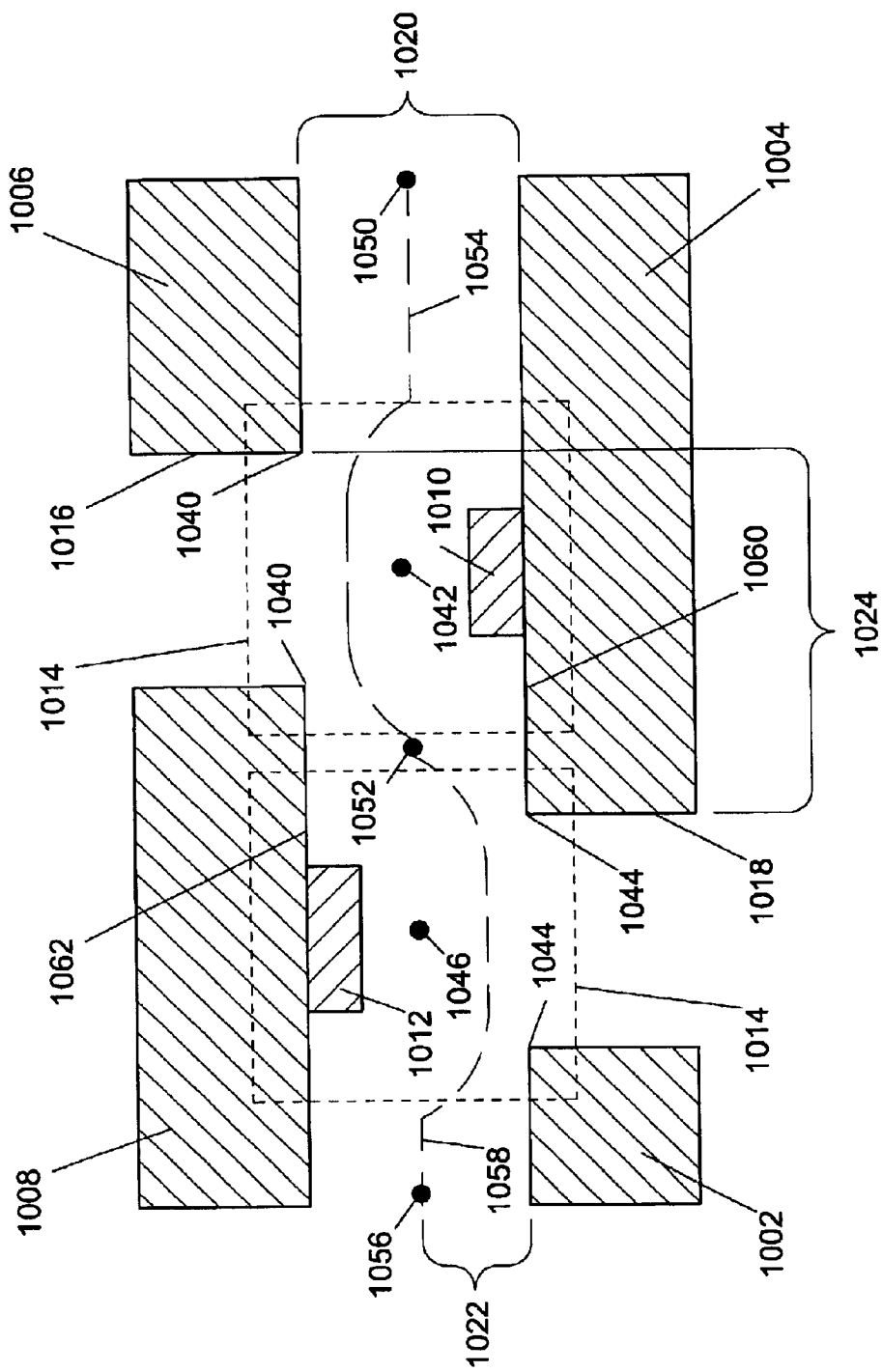
FIG. 10 illustrates an enlarged, top-down view of an area of a metal line layout where a shifted, four-way intersection exists, in accordance with another embodiment of the invention.

FIG. 10 illustrates an enlarged, top-down view of a metal line layout where a shifted, four-way intersection of metal features 1002, 1004, 1006, 1008 exists, in accordance with another embodiment of the invention. Where the intersection depicted in FIG. 10 was originally a four-way intersection such as that depicted in FIG. 9, the layer has been altered so that the four-way intersection is converted to two three-way intersections 1014, by shifting two or more of the metal features 1002, 1004 and/or 1006, 1008 by a distance 1024. Accordingly, the vertical edges 1016 and 1018 of features 1006 and 1004 no longer align. This shift cuts in half a depression in the center of the intersection that otherwise would have resembled depression 450 of FIG. 4.

In addition, additional metal features 1010, 1012 have been added to metal features 1004 and 1008, respectively, in accordance with an embodiment of the invention. The additional metal features 1010, 1012 are positioned so as to extend the highest attitude of the top surface of the IDL into the area where substantial depressions (e.g., depression 550, FIG. 5) would occur if features 1010, 1012 were not present.

Between points 1050 and 1052, dashed IDL contour line 1054 illustrates where the IDL that overlies features 1004 and 1010 would start to droop when $S_{met}$ 1020 roughly equals $2*T_{IDL}$, where $T_{IDL}$ is indicated by reference number 1022. No substantial droop will occur in the center 1042 of the right-hand intersection, as it would with prior art metal line layouts. Instead, the top surface of the IDL is substantially flat across the intersection or a fused trench exists.

Between points 1052 and 1056, dashed IDL contour line 1058 illustrates where the IDL that overlies features 1008 and 1012 would start to droop when $S_{met}$ 1020. roughly equals $2*T_{IDL}$. No substantial droop will occur in the center 1046 of the left-hand intersection, as it would with prior art metal line layouts. Instead, the top surface of the IDL is substantially flat across the intersection or a fused trench exists.

In the embodiment shown in FIG. 10, the additional metal features 1010 and 1012 are connected to substantially straight sides 1060, 1062 of metal features 1004, 1008, respectively, and the metal features 1010, 1012 extend toward the centers 1042, 1046 of the intersections. In other embodiments, metal features could be positioned in other locations (e.g., in proximity to corners 1040, 1044), while still substantially increasing the flatness of the IDL across the intersections 1014.

Method of Forming Modified Metal Features Within Semiconductor Devices

Figure 11:
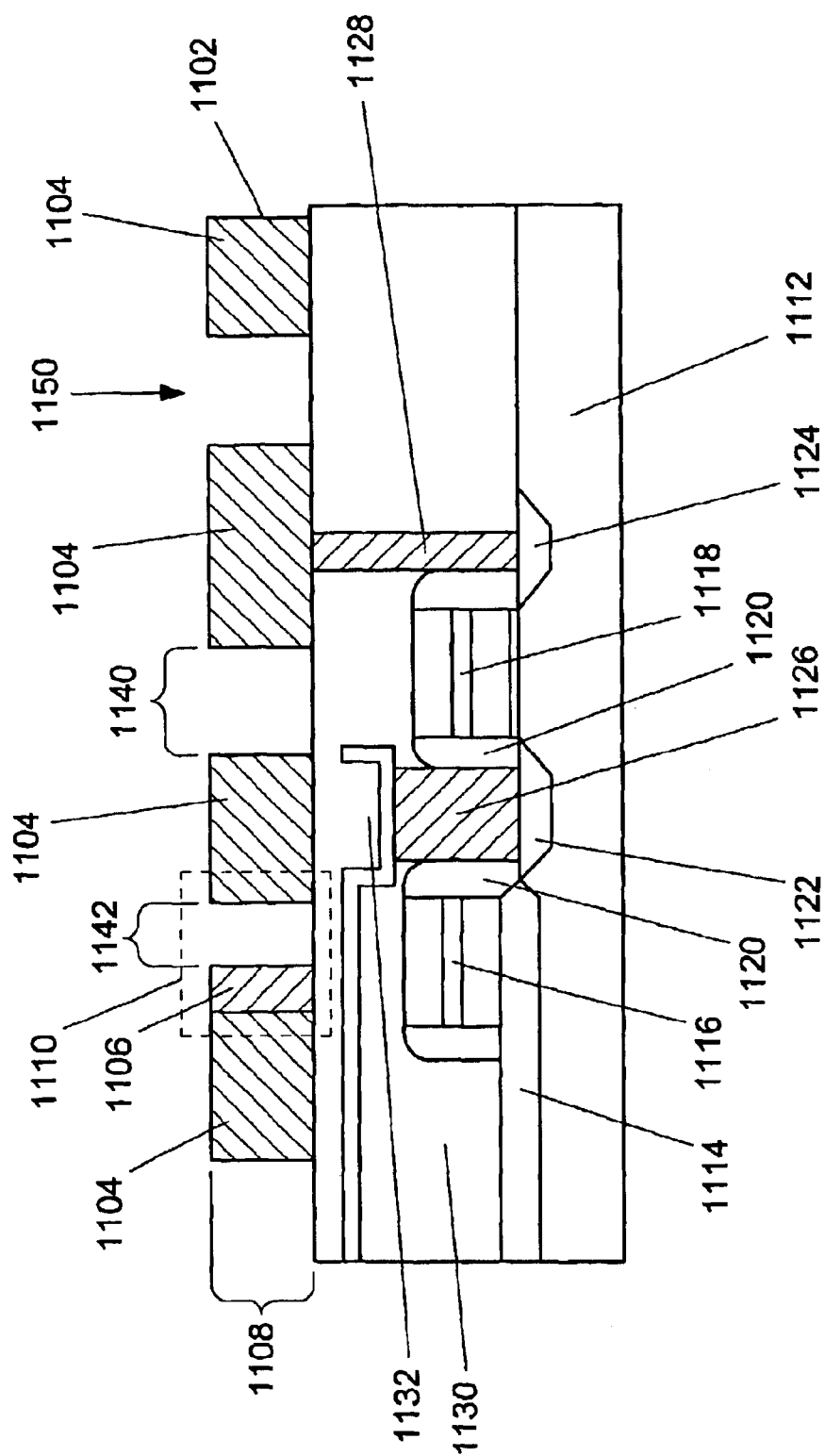
FIGS. 11–13 illustrate side, cross-sectional views of a portion of a semiconductor device during various fabrication stages, in accordance with an embodiment of the present invention.
Figure 12:
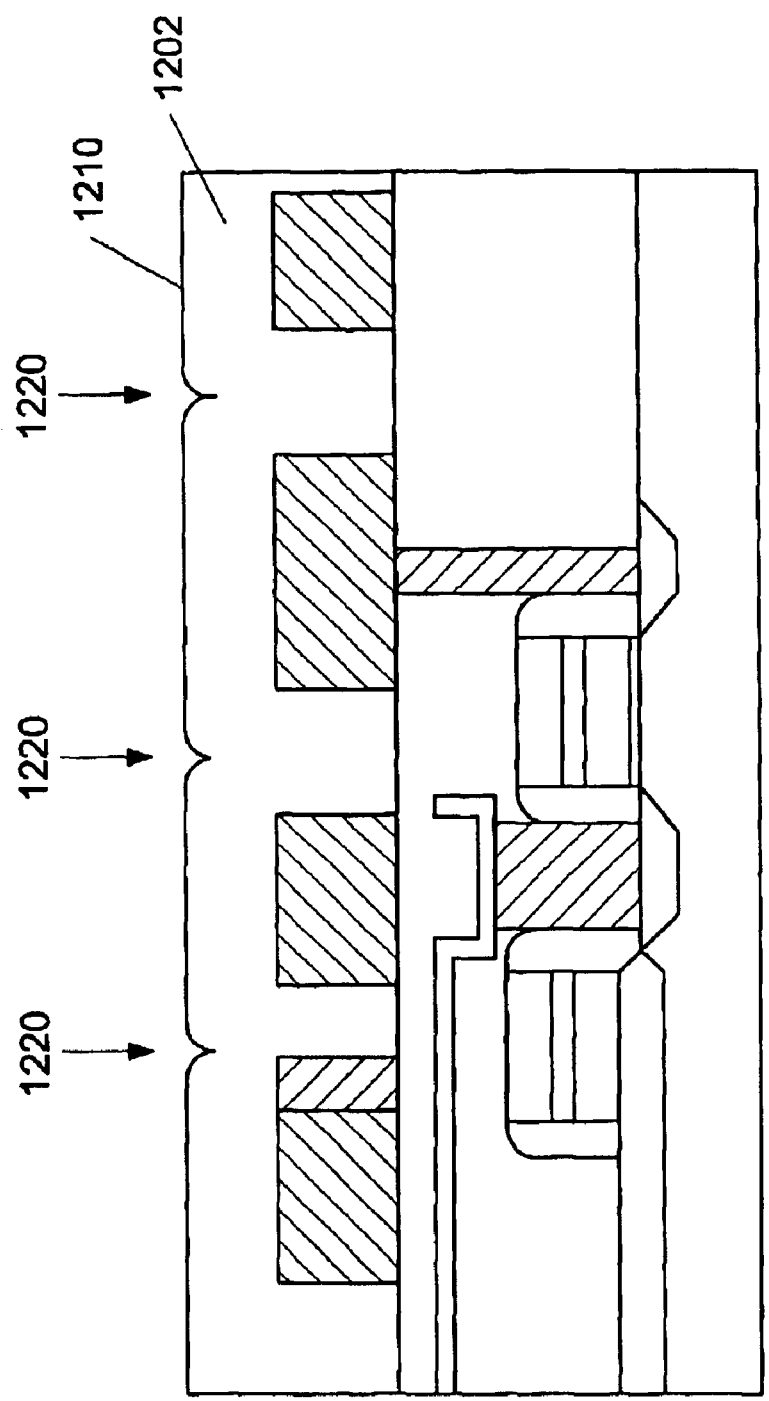
Figure 13:
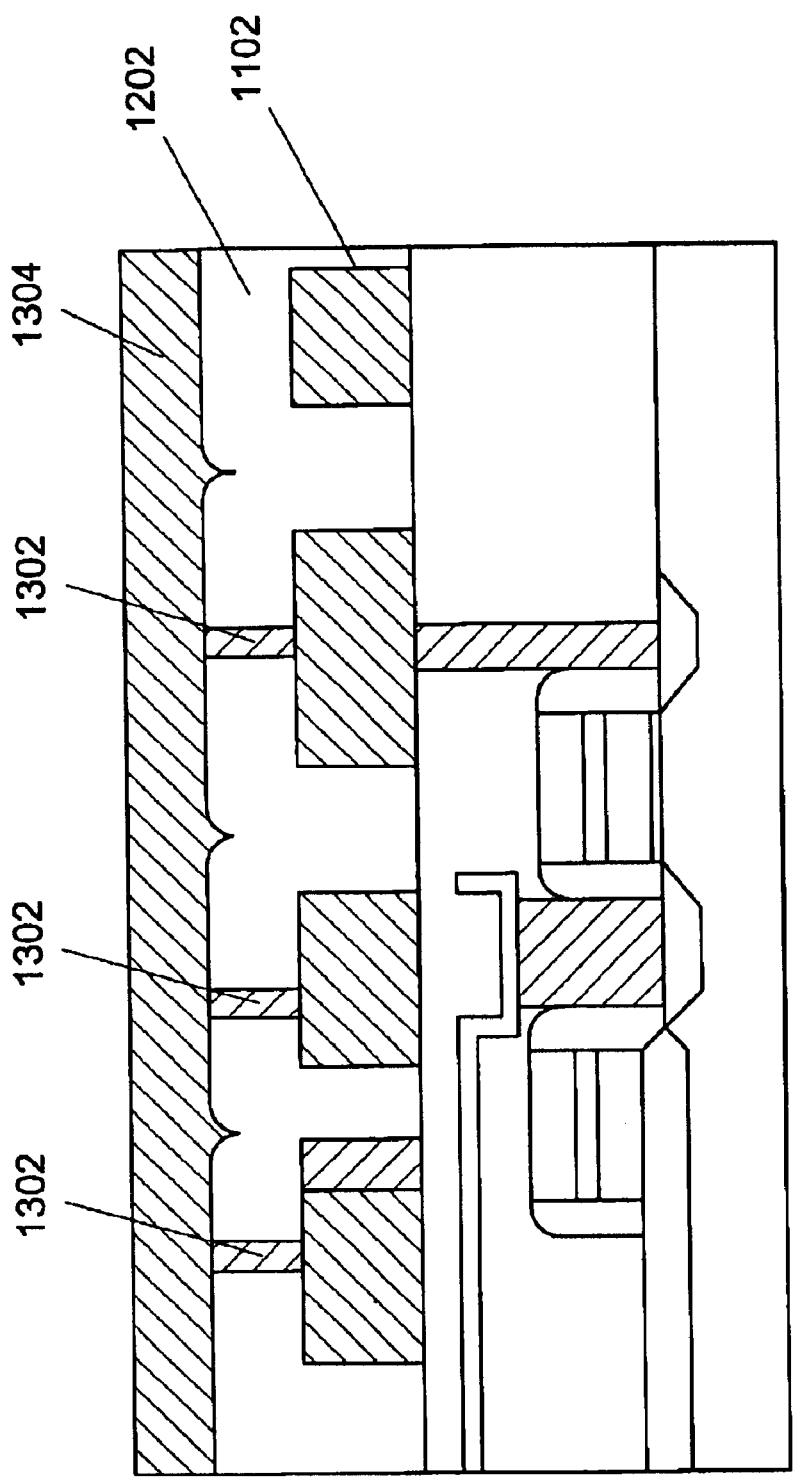

FIGS. 11–13 illustrate side, cross-sectional views of a portion of an integrated circuit device during various fabrication stages, in accordance with an embodiment of the present invention. In one embodiment, modified metal features are included within one or more metal layers of a memory device, such as a DRAM (Dynamic Random Access Memory). In other embodiments, the modified metal features could be included within one or more layers of other types of devices. For illustration purposes, these figures depict the formation of a portion of a DRAM memory device, and a single memory cell is illustrated.

A typical DRAM includes an array of memory cells. Each cell has an address identifying its location in the array. The array includes a configuration of intersecting conductive lines, and memory cells are associated with the intersections of the lines. In order to read from or write to a cell, the particular cell in question must be selected or addressed. The address for the selected cell is represented by input signals to a word line decoder and to a digit line decoder. The word line decoder activates a word line in response to the word line address. The selected word line activates the access gates for each of the memory cells in communication with the selected word line. The digit line decoder selects a digit line pair in response to the digit line address. For a read operation, the selected word line activates the access gates for a given word line address, and data is latched to the digit line pairs.

A DRAM cell generally consists of a capacitor 1132 coupled through a transistor 1118 to a digit line 1104. In one embodiment, metal layer 1102 includes the digit line 1104 to the memory cell. Transistor 1118 is activated when a signal is provided from digit line 1104 through a conductive contact 1128 to doped node region 1124. When activated, transistor 1118 allows data to be stored into or retrieved from capacitive structure 1132.

The wafer fragment illustrated in FIG. 11 includes a semiconductive material 1112, field oxide region 1114, and wordlines 1116, 1118. Spacers 1120 are adjacent wordlines 1116, 1118. Node locations 1122, 1124 are adjacent to wordlines 1116, 1118, and are diffusion regions within semiconductive material 1112.

Conductive structure 1126 and contact 1128 extend upward from node locations 1122, 1124 into or through insulating material 1130. The upper surface of conductive structure 1126 contacts a capacitor construction 1132, which serves to store a bit of information. Contact 1128 connects to a portion 1104 of a metal layer 1102 overlying insulating material 1130.

To begin the process of forming an integrated circuit, a portion of a semiconductor device is formed, as illustrated in FIG. 11. Although a detailed description of the processes used to form the illustrated semiconductor device portion is outside the scope of this patent, and such processes are well known to those of skill in the art, a basic description is given below.

Basically, forming the illustrated semiconductor device portion involves forming MOS devices (e.g., transistor 1118) and nodes (e.g., node 1124) on substrate 1112 using a sequence of material deposition, doping, and etching processes. Insulating material 1130 is then deposited over the MOS devices and nodes. In one embodiment, insulating material 1130 is formed from tetraethyloxysilicate (TEOS) and/or borophosphosilicate glass (BPSG), although silicon oxide or other suitable materials could be used, as well. Conventionally, the TEOS and BPSG are used to form capacitors in the DRAM. In addition, the insulating material 1130 could include additional dielectric formed on top of the TEOS and BPSG, to create a capacitor container and an insulator between contacts (e.g., contact 1128). The additional dielectric could be a nitride, an oxide, or a combination thereof.

In one embodiment, the insulating material 1130 is planarized after deposition of the BPSG and/or additional dielectric materials, and before formation of a contact opening (i.e., an opening in which contact 1128 will be formed). Preferably, chemical-mechanical polishing (CMP) is used, resulting in a substantially flat topology on the top surface of the device. Other mechanical or non-mechanical smoothing techniques may also be used, such as alternative etch processes (e.g., reactive ion etching (RIE)) or chemical dissolution. In another alternate embodiment, these planarization processes are not performed.

A contact opening is then etched through the insulating material 1130 to an underlying area of the semiconductor device, using a conventional photolithographic and etching procedures. The diameter of the contact hole is in a range of about 0.2–0.35 microns, in one embodiment, although the width could be greater than or less than this range, as well.

Contact material is then deposited within the contact opening. The contact material can include relatively thin adhesive and barrier layers, and a thicker layer of contact material (e.g., tungsten), which substantially fills the contact hole. In one embodiment, deposition of these layers is accomplished using chemical vapor deposition (CVD) and/or physical vapor deposition (PVD) processes. An etching or other material removal procedure (e.g., a chemical mechanical procedure) is then performed to remove unwanted contact material from the top surface of the insulating material 1130, in one embodiment.

In one embodiment, some or all digit lines are provided within the first metal layer 1102, which is located above the top surface of insulating material 1130. Thus, after the portion of the semiconductor device is formed, a conductive layer 1102 is deposited above (e.g., on the top surface of) the insulating material 1130, and the layer 1102 is patterned. This conductive layer is referred to herein as the first metal layer, or the "M1" layer.

In one embodiment, the M1 layer 1102 includes three layers of conductive material, which are sequentially deposited using standard deposition techniques (e.g., CVD and/or PVD). In one embodiment, the lowest layer includes titanium, and has a thickness in a range of about 80–120 angstroms, with a thickness of about 100 angstroms being present in one embodiment. The middle layer includes an aluminum/copper alloy, and has a thickness in a range of about 2500–3500 angstroms, with a thickness of about 3000 angstroms being present in one embodiment. The top layer includes titanium nitride, and has a thickness in a range of about 200–300 angstroms, with a thickness of about 250 angstroms being present in one embodiment.

In other embodiments, the titanium, aluminum, and titanium nitride layers could be thicker or thinner than the ranges specified above. In still other embodiments, the M1 layer 1102 could include more or fewer conductive layers (e.g., from 1 to 10), or those layers could be formed from different materials (e.g., copper), or those layers could be arranged in a different configuration (e.g., a titanium nitride layer could exist as the bottom layer).

After depositing the conductive material of the M1 layer 1102, the layer is patterned using a photolithography and etching process, in one embodiment. Portions of the layer are selectively removed to form a patterned metal layer above the top surface of the insulating material 1130. First, a layer of photoresist material (not shown) is deposited above the unpatterned M1 layer 1102. The resist layer is formed from a material that is light or energy sensitive, such that resist material receiving exposure will have physical characteristics different from resist material not receiving exposure. Such resist materials are typically reactive to a specific set or range of energy types (e.g., a specific set or range of wavelengths of light).

In one embodiment, the resist layer is formed from an antireflection coating material, which is a dark material that helps in the imaging and patterning of M1 layer 1102. This coating also can slow later etching processes down, in some cases. In one embodiment, the antireflection coating is formed from siliconoxynitride. In other embodiments, numerous other photoresist compositions (e.g., titanium nitride) and technologies could be used.

A reticle or mask is placed over the resist layer in order to selectively block waves directed toward the surface of the resist layer. In one embodiment, the reticle or mask is designed so that standard spacing, 1140, exists between all metal features 1104 of the metal layer, except in some or all of the areas that include intersections and additional metal features 1106, in which reduced spacing 1142 exists between metal features. The additional metal features 1106 extend the areas where the top surface of a subsequently deposited IDL (e.g., IDL 1202, FIG. 12) would otherwise have a significant depression (e.g., depression 130 or 132, FIG. 1) in an area that includes an intersection.

After placing the mask over the resist layer, the resist layer is exposed to electromagnetic radiation or light waves, typically UV light, of a type capable of exposing the resist material in the resist layer. In one embodiment, the resist layer contains photoresist material of a positive type (i.e., that which is more easily removed, or more vulnerable to solvents, when exposed to light or energy). Exposed resist portions are then removed using conventional washing techniques (e.g., washing with a solution of aqueous TMAH), leaving portions of the M1 layer 1102 uncovered. In an alternate embodiment, a negative type photoresist could be used (i.e., that which is more resistant to removal, when exposed to light or energy, than unexposed areas of the resist). In the latter embodiment, the mask or reticle would be appropriately and obviously modified.

After the photoresist is selectively removed, a patterned layer of resist remains on the top surface of M1 layer 1102. Uncovered portions of M1 layer 1102 are then modified and removed, resulting in the formation of M1 openings 1150. In one embodiment, the uncovered portions of the M1 layer 1102 are removed using an anisotropic RIE procedure at a pressure between about 6 to 20 mtorr, although other etching procedures and/or pressures outside this range could alternatively be used. This involves applying an etching compound to the remaining photoresist and the uncovered portions of the M1 layer 1102. The etching compound selectively etches the conductive material within the M1 layer 1102. In one embodiment, the etching compound is a chlorine based etchant, having an etch chemistry comprised of between about 20 to 80% chlorine, and between about 20 to 80% $BCl_3$. Additive reactants, such as argon, nitrogen, $CHF_3$, and $CH_4$, between about 0 to 40%, can also be included in the etching ambient. Numerous other etching materials, such as $Cl_2$, for example, could be used in other embodiments. The selection of the particular material used depends on the conductive material forming the M1 layer, the speed of the desired etch, the materials at which the etch should terminate, and other factors. In various embodiments, anisotropic, isotropic, wet or dry etches, or a combination of these types of etches could be used.

In one embodiment, underexposed resist portions are then removed using techniques well known to those of skill in the art, such as plasma oxygen ashing and careful wet cleans. In other embodiments, the underexposed resist portions remain on the surface of the patterned M1 layer 1102 or are removed at a later time.

In one embodiment, the patterned M1 layer 1102 includes metal lines and features, some of which are electrically isolated. Although from one to many parallel metal lines could be included in a particular patterned layer, at least three parallel lines are present in one embodiment.

As described previously, parallel lines and features have a standard spacing, $S_{met}$ 1140, between them, except in areas (e.g., area 1110) where additional metal features 1106 are included, which have a reduced spacing 1142. In one embodiment, the additional metal features 1106 result in a fully self-planarized IDL. The reduced spacing 1142 may or may not be a standard value. Each metal feature 1104, 1106 has a thickness, $T_{met}$ 1108, above the underlying insulating material 1130, and that thickness is substantially equal across all metal lines and features within the layer 1102, in one embodiment.

After forming the portion of the integrated circuit and the overlying patterned conductive layer 1102, an IDL material is deposited above the M1 layer 1102. FIG. 12 illustrates a side, cross-sectional view of the device portion of FIG. 11, after IDL material 1202 has been deposited over the M1 layer 1102. Deposition of IDL 1202 is performed in a manner known to persons skilled in the art.

In one embodiment, IDL 1202 is formed from tetraethyloxysilicate (TEOS), and IDL 1202 has a thickness, $T_{IDL} \leq \frac{1}{2} S_{met}$. For example, $T_{IDL}$ could be in a range of about 4500–5500 angstroms, with a thickness of about 5000 angstroms being present in one embodiment. In other embodiments, IDL 1202 could be formed from other suitable dielectric materials, and could be thicker or thinner than the range specified above. For example, IDL 1202 could include other insulating materials, such as oxides or nitrides.

In one embodiment, the top surface 1210 of IDL 1202 is substantially self-planarized upon depositing the IDL material. As FIG. 12 indicates, the top surface 1210 of IDL 1202 is substantially flat, except that one or more fused trenches 1220 may exist in the top surface. In most cases, the fused trenches 1220 are not a concerning factor in the deposition of subsequent metal layers. Accordingly, the term "substantially self-planarized" means that the top surface of the IDL does not need a separate planarization procedure in order for one or more additional layers to be reliably formed on top of the IDL, even though one or more fused trenches 1220 may exist on the surface.

The flat topography of the IDL is possible across an entire surface of IDL 1202 using embodiments of the present invention. A subsequent planarization process of the top surface 1210 is not performed, in one embodiment, before deposition of the next metal layer. In another embodiment, a separate planarization process can be performed. For example, a CMP process could be used to further planarize the top surface 1210. Other mechanical or non-mechanical smoothing techniques may also be used, such as alternative etch processes (e.g., RIE) or chemical dissolution. If such a subsequent planarization process is performed, it would not be necessary to remove as much material as is necessary using prior art methods, because the top surface 1210 of IDL 1202 is substantially flatter, using embodiments of the invention, than is possible using prior art methods. For example, a planarization process that removes approximately 1000 angstroms of dielectric material or less could be performed, in accordance with one embodiment. Using prior art methods, such a relatively small amount of planarization would not yield an acceptably flat IDL topography, unless $T_{IDL}$ were substantially more than $\frac{1}{2} S_{met}$.

Subsequent processing steps can then be performed to form interconnections with the M1 layer and to complete the integrated circuit. For example, referring to FIG. 13, conductive vias 1302 are formed through IDL 1202, and another patterned conductive layer 1304 is formed above IDL 1202. Vias 1302 provide interconnections between the M1 layer 1102 and the overlying conductive layer 1304, which is sometimes referred to as the M2 layer. The M2 layer 1304 and vias 1302 are formed using techniques and materials well known to those of skill in the art.

After patterning the M2 layer 1304, one or more additional layers of dielectric and conductive material can be built on top of the M2 layer 1304 (e.g., M3, M4, etc.). In addition, interconnects between the M1, M2, and/or the new conductive layers can be formed. Alternatively, a passivation layer can be formed on top of the M2 layer 1304, after which the device build-up process can be considered to be essentially complete.

Although the modified metal layer 1102 is shown in the above example to be a layer just above and in contact with a portion of a semiconductor device (i.e., the M1 layer), one or more other layers (e.g., M2 layer 1304) could alternatively or additionally be modified using embodiments of the invention. Also, even though vias 1302 are shown to interconnect only the M1 and M2 layers 1102, 1302, vias 1302 could be used to provide interconnections between other layers, as well.

It will be understood that the above description of a DRAM cell is intended to provide a general understanding of the memory and is not a complete description of all the elements and features of a DRAM. Although the description shows how embodiments of the present invention are implemented in a DRAM, modified metal layers could be used within other types of devices, as well. For example, the embodiments of the present invention could be implemented in other types of memory devices, microprocessors, Application Specific Integrated Circuits (ASICs) or virtually any other semiconductor device having two or more metal layers. In particular, the invention is equally applicable to any size and type of memory circuit and is not intended to be limited to the DRAM described above. Other alterative types of devices include SRAM (Static Random Access Memory) or Flash memories. Additionally, the DRAM could be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM), as well as Synchlink or Rambus DRAMs.

The memory cells described above can form a portion of a memory device, in accordance with various embodiments. This memory device can be, for example, a DRAM, SRAM, Flash memory or other type of memory device. Alternatively, the modified metal layers and their formation methods, described in conjunction with the various embodiments above, can be integrated into another type of device (e.g., a microprocessor or ASIC).

Memory Devices

Figure 14:
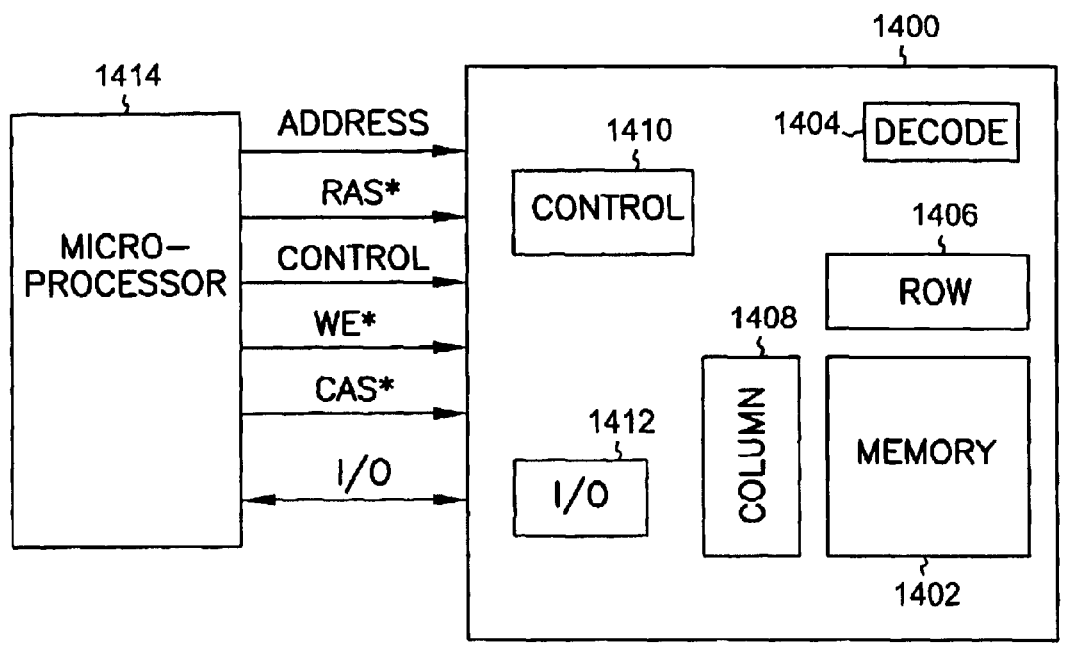
FIG. 14 is a simplified block diagram of an integrated circuit memory device in accordance with an embodiment of the invention.

FIG. 14 is a simplified block diagram of an integrated circuit memory device according to one embodiment of the invention. In one embodiment, memory cells, such as those described in conjunction with FIG. 13, are suitable for use in memory devices. Other types of memory cells having structures well understood in the art are also suitable for use in memory devices.

The memory device 1400 includes an array of memory cells 1402, address decoder 1404, row access circuitry 1406, column access circuitry 1408, control circuitry 1410, and Input/Output circuit 1412. The memory can be coupled to an external microprocessor 1414, or memory controller for memory accessing. The memory receives control signals from the processor 1414, such as WE*, RAS* and CAS* signals. The memory is used to store data which is accessed via I/O lines. It will be appreciated by those skilled in the art that additional circuitry and control signals can be provided, and that the memory device of FIG. 14 has been simplified to help focus on the invention. The memory device is formed using techniques described above, in accordance with the various embodiments of the invention.

As recognized by those skilled in the art, memory devices of the type described herein are generally fabricated as an integrated circuit containing a variety of semiconductor devices. The integrated circuit is supported by a substrate. Integrated circuits are typically repeated multiple times on each substrate. The substrate is further processed to separate the integrated circuits into dies as is well known in the art.

Semiconductor Dies

Figure 15:
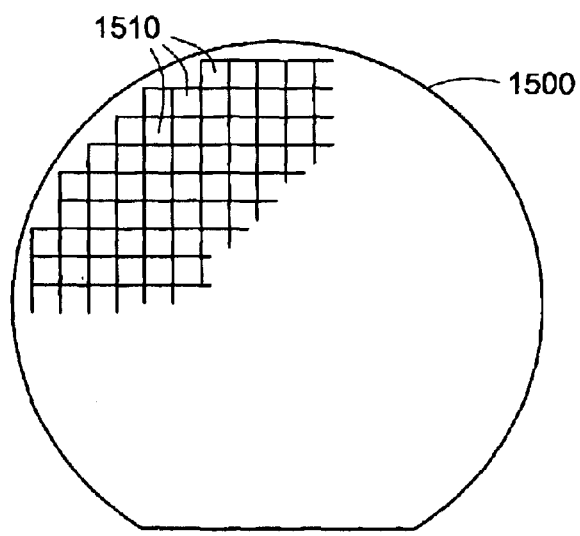
FIG. 15 is a top-down, elevation view of a wafer containing semiconductor dies in accordance with an embodiment of the invention.

FIG. 15 is a top-down, elevation view of a wafer 1500 containing semiconductor dies 1510 in accordance with an embodiment of the invention. A die is an individual pattern, typically rectangular, on a substrate that contains circuitry, or integrated circuit devices, to perform a specific function. At least one of the integrated circuit devices includes a modified metal layer, embodiments of which are disclosed herein. A semiconductor wafer will typically contain a repeated pattern of such dies containing the same functionality. Die 1510 may contain circuitry for the inventive memory device, as discussed above. Die 1510 may further contain additional circuitry to extend to such complex devices as a monolithic processor with multiple functionality. Die 1510 is typically packaged in a protective casing (not shown) with leads extending therefrom (not shown) providing access to the circuitry of the die for unilateral or bilateral communication and control.

Circuit Modules

Figure 16:
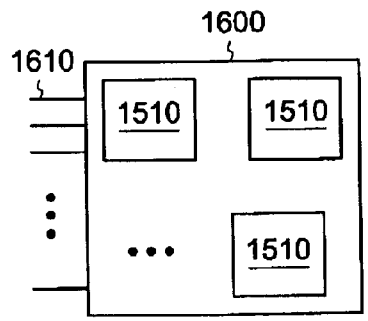
FIG. 16 is a simplified block diagram of an exemplary circuit module in accordance with an embodiment of the invention.

FIG. 16 is a simplified block diagram of an exemplary circuit module 1600 in accordance with an embodiment of the invention. As shown in FIG. 16, two or more dies 1510 may be combined, with or without protective casing, into circuit module 1600 to enhance or extend the functionality of an individual die 1510. Circuit module 1600 may be a combination of dies 1510 representing a variety of functions, or a combination of dies 1510 containing the same functionality. Some examples of a circuit module include memory modules, device drivers, power modules, communication modems, processor modules, and application-specific modules and may include multilayer, multichip modules. Circuit module 1600 may be a subcomponent of a variety of electronic systems, such as a clock, a television, a cellular or radio communication device (e.g., cell phone, pager, etc.), a desktop, handheld or portable computer, an automobile, an industrial control system, an aircraft, an automated teller machine, and others. Circuit module 1600 will have a variety of leads 1610 extending therefrom and coupled to the dies 1510 providing unilateral or bilateral communication and control.

Figure 17:
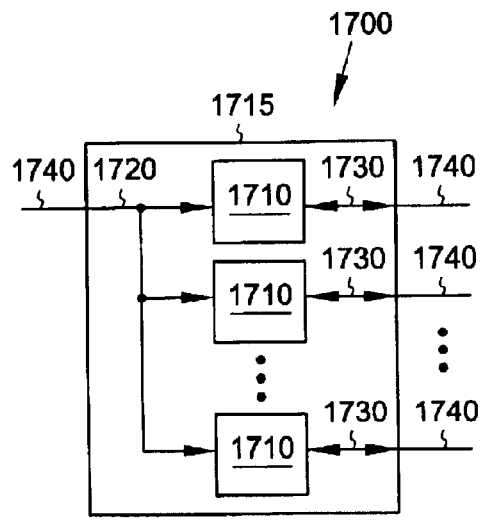
FIG. 17 is a simplified block diagram of an exemplary memory module in accordance with an embodiment of the invention.

FIG. 17 is a simplified block diagram of an exemplary memory module 1700, which is one embodiment of a circuit module. Memory module 1700 generally depicts a Single Inline Memory Module (SIMM) or Dual Inline Memory Module (DIMM). A SIMM or DIMM is generally a printed circuit board (PCB) or other support containing a series of memory devices. While a SIMM will have a single in-line set of contacts or leads, a DIMM will have a set of leads on each side of the support with each set representing separate I/O signals. Memory module 1700 contains multiple memory devices 1710 contained on support 1715, the number depending upon the desired bus width and the desire for parity. Memory module 1700 may contain memory devices 1710 on both sides of support 1715. Memory module 1700 accepts a command signal from an external controller (not shown) on a command link 1720 and provides for data input and data output on data links 1730. The command link 1720 and data links 1730 are connected to leads 1740 extending from the support 1715. Leads 1740 are shown for conceptual purposes and are not limited to the positions shown in FIG. 17.

Electronic Systems

Figure 18:
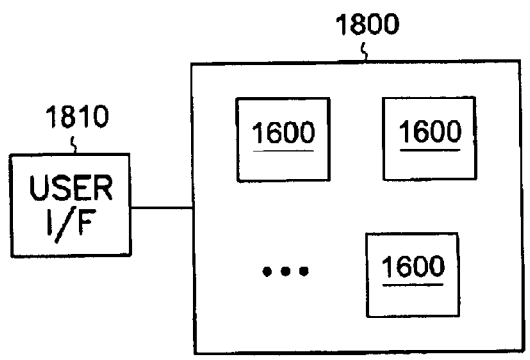
FIG. 18 is a simplified block diagram of an exemplary electronic system in accordance with an embodiment of the invention.

FIG. 18 is a simplified block diagram of an exemplary electronic system 1800 in accordance with an embodiment of the invention. Electronic system 1800 contains one or more circuit modules 1600. Electronic system 1800 generally contains a user interface 1810. User interface 1810 provides a user of the electronic system 1800 with some form of control or observation of the results of the electronic system 1800. Some examples of user interface 1810 include a keyboard, pointing device, monitor, and printer of a computer, a keypad, speaker, microphone, and display of a communication device; a tuning dial, display, and speakers of a radio; an ignition switch and gas pedal of an automobile; and a card reader, keypad, display, and currency dispenser of an automated teller machine. User interface 1810 may further describe access ports provided to electronic system 1800. Access ports are used to connect an electronic system to the more tangible user interface components previously exemplified.

One or more of the circuit modules 1600 may be a processor providing some form of manipulation, control or direction of inputs from or outputs to user interface 1810, or of other information either preprogrammed into, or otherwise provided to, electronic system 1800. As will be apparent from the lists of examples previously given, electronic system 1800 will often contain certain mechanical components (not shown) in addition to circuit modules 1600 and user interface 1810. It will be appreciated that the one or more circuit modules 1600 in electronic system 1800 can be replaced by a single integrated circuit. Furthermore, electronic system 1800 may be a subcomponent of a larger electronic system.

Figure 19:
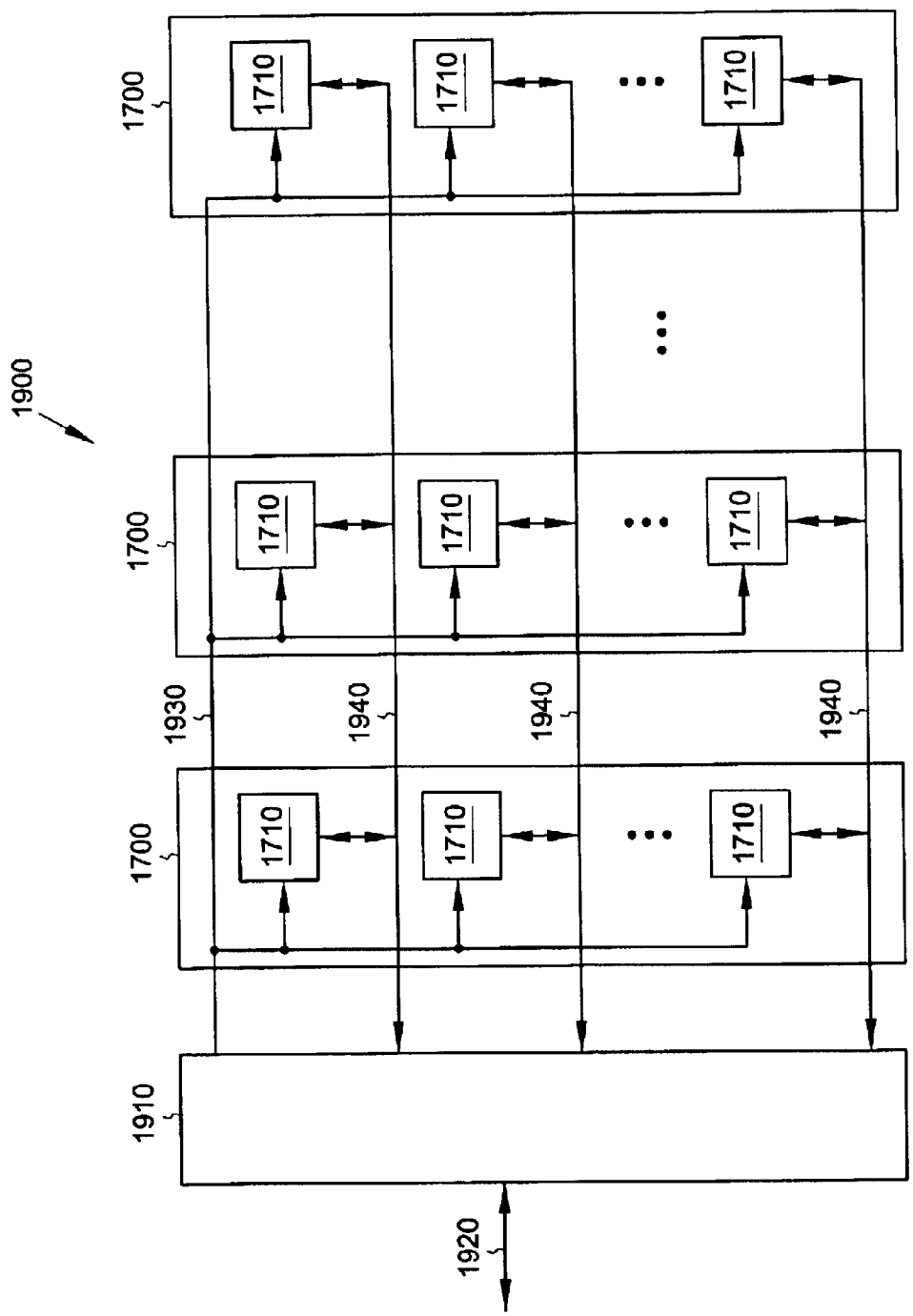
FIG. 19 is a simplified block diagram of an exemplary memory system in accordance with an embodiment of the invention.

FIG. 19 is a simplified block diagram of an exemplary memory system 1900, which is one embodiment of an electronic system. Memory system 1900 contains one or more memory modules 1700 and a memory controller 1910. Memory controller 1910 provides and controls a bidirectional interface between memory system 1900 and an external system bus 1920. Memory system 1900 accepts a command signal from the external bus 1920 and relays it to the one or more memory modules 1700 on a command link 1930. Memory system 1900 provides for data input and data output between the one or more memory modules 1700 and external system bus 1920 on data links 1940.

Figure 20:
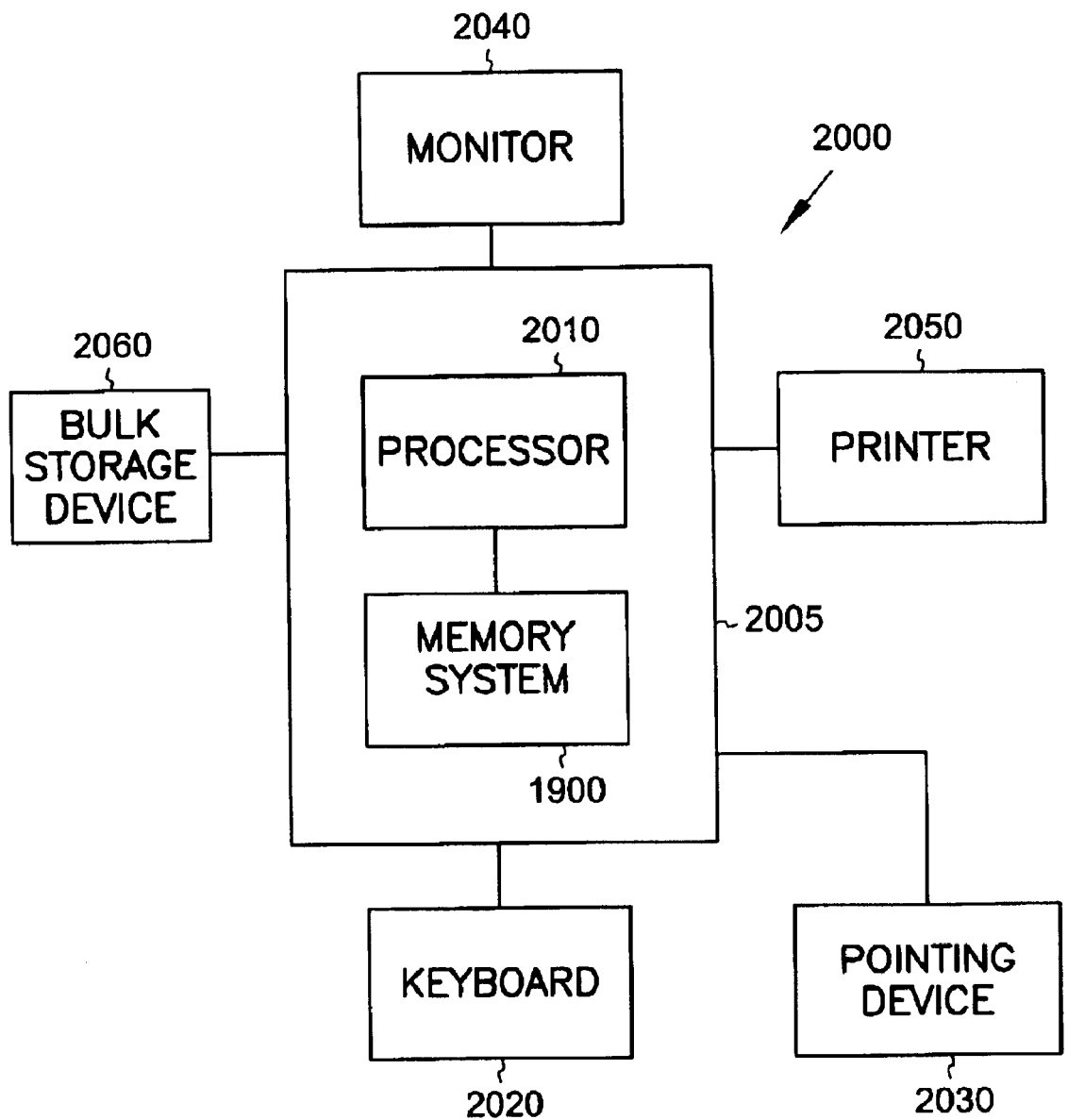
FIG. 20 is a simplified block diagram of an exemplary computer system in accordance with an embodiment of the invention.

FIG. 20 is a simplified block diagram of an exemplary computer system 2000, which is a further embodiment of an electronic system. Computer system 2000 contains a processor 2010 and a memory system 2000 housed in a computer unit 2005. Computer system 2000 is but one example of an electronic system containing another electronic system (e.g., memory system 1900) as a subcomponent. Computer system 2000 optionally contains user interface components. Depicted in FIG. 20 are a keyboard 2020, a pointing device 2030, a monitor 2040, a printer 2050, and a bulk storage device 2060. It will be appreciated that other components are often associated with computer system 2000 such as modems, device driver cards, additional storage devices, etc. It will further be appreciated that the processor 2010 and memory system 1900 of computer system 2000 can be incorporated on a single integrated circuit. Such single package processing units reduce the communication time between the processor and the memory circuit.

Conclusion

For reliability and manufacturing reasons, it is necessary for an IDL to be sufficiently flat before depositing a metal layer on its top surface. Prior art methods of planarizing an IDL involve depositing a relatively thick IDL, then performing a separate planarization procedure to reduce the thickness and flatten the surface. Other prior art methods involve modifying the metal layer to standardize the distance between nearest parallel and diagonal metal features. However, these prior art methods do not address depressions that are formed in the top of the IDL layer when nearly a minimum amount of IDL material is used (i.e., when $T_{IDL}$ approximately equals $\frac{1}{2}S_{met}$. Accordingly, a thicker IDL must be used to self-planarize the top surface, which results in subsequently formed vias having relatively high aspect ratios. These shortcomings of prior art methods and structures affect manufacturing costs and yields.

Embodiments of the present invention provide a modified metal layer that includes additional metal features in areas that include intersections. These additional metal features allow a minimum amount of IDL material to be used (e.g., $T_{IDL} \approx \frac{1}{2}S_{met}$), while still achieving a self-planarized top surface. Accordingly, the aspect ratio of subsequently formed vias is relatively low, and a separate planarization procedure is not necessary to flatten the top surface of the IDL. Accordingly, the various embodiments of the invention decrease the cost and complexity of the manufacturing process, while increasing yields and reliability.

While the invention has been described and illustrated with respect to forming a metal layer associated with a memory cell, it should be apparent that the same processing techniques can be used to form conductive layers associated with other integrated circuit devices. In addition, the methods of the various embodiments can be used for other applications besides integrated circuits. Modifications that would be apparent to those of skill in the art could be made to the methods of the various embodiments to apply the methods to other integrated circuits, integrated circuit packages, interposers, printed circuit boards, and other structures that include patterned metal layers with an overlying dielectric layer.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method for fabricating an integrated circuit structure, the method comprising:
    depositing a conductive layer above an insulating material;
    patterning the conductive layer to form a plurality of first metal features and at least one second metal feature, wherein
        the first metal features and the at least one second metal feature have a substantially equal thickness, $T_{met}$, above the insulating material, and
        the first metal features have a substantially standard distance, $S_{met}$, between parallel edges of adjacent ones of the first metal features, and
        the at least one second metal feature is connected to one or more of the first metal features in proximity to an intersection area of the conductive layer,
        wherein an intersection area is a roughly rectangular area that includes at least one metal feature corner, parts of at least one other metal feature that are in close proximity to the at least one metal feature corner, and a portion of a dielectric layer that will be located between the at least one metal feature corner and the parts of the at least one other metal feature; and
    depositing the dielectric layer having a thickness, $T_{IDL}$, over the conductive layer.

2. The method of claim 1, wherein patterning the conductive layer comprises performing a photolithography process and a reactive ion etching process.

3. The method of claim 1, wherein patterning the conductive layer comprises patterning the at least one second metal feature so that a distance between the at least one second metal feature and another metal feature is less than $S_{met}$.

4. The method of claim 1, wherein the plurality of first metal features includes a plurality of electrically unisolated metal lines, wherein at least three of the electrically unisolated metal lines are substantially parallel.

5. The method of claim 4, wherein the plurality of first metal features further includes a plurality of electrically isolated metal features, which function to provide the substantially standard distance between the parallel edges of the first metal features.

6. The method of claim 1, wherein an altitude of the dielectric layer above the insulating material roughly equals $T_{met}+T_{IDL}$ over a metal feature, and the at least one second metal feature maintains an altitude of a portion of the dielectric layer that overlies the intersection area to roughly $T_{met}+T_{IDL}$.

7. The method of claim 1, wherein a top surface of the dielectric layer is substantially self-planarized upon depositing the dielectric layer.

8. The method of claim 1, further comprising performing a separate planarizing procedure on a top surface of the dielectric layer.

9. The method of claim 8, wherein performing the separate planarizing procedure comprises removing approximately 1000 angstroms of dielectric material from the top surface of the dielectric material.

10. The method of claim 1, wherein the method proceeds in the order presented.

11. A method for fabricating an integrated circuit structure, the method comprising:
    forming a portion of a semiconductor device, which includes a layer of insulating material that defines a top surface of the portion of the semiconductor device;
    depositing a conductive layer above the layer of insulating material;
    patterning the conductive layer to form a plurality of first metal features and at least one second metal feature, wherein
        the first metal features and the at least one second metal feature have a substantially equal thickness, $T_{met}$, above the insulating material, and
        the first metal features have a substantially standard distance, $S_{met}$, between parallel edges of adjacent ones of the first metal features, and
        the at least one second metal feature is connected to one or more of the first metal features in proximity to an intersection area of the conductive layer,
        wherein an intersection area is a roughly rectangular area that includes at least one metal feature corner, parts of at least one other metal feature that are in close proximity to the at least one metal feature corner, and a portion of a dielectric layer that will be located between the at least one metal feature corner and the parts of the at least one other metal feature; and depositing the dielectric layer having a thickness, $T_{IDL}$, over the conductive layer.

12. The method of claim 11, wherein forming the portion of the semiconductor device comprises forming a memory cell.

13. The method of claim 12, wherein forming the memory cell comprises forming a Dynamic Random Access Memory (DRAM) memory cell.

14. The method of claim 11, wherein an altitude of the dielectric layer above the insulating material roughly equals $T_{met}+T_{IDL}$ over a metal feature, and the at least one second metal feature maintains an altitude of a portion of the dielectric layer that overlies the intersection area to roughly $T_{met}+T_{IDL}$.

15. The method of claim 11, wherein a top surface of the dielectric layer is substantially self-planarized upon depositing the dielectric layer.

16. The method of claim 11, wherein the method proceeds in the order presented.

17. A method for fabricating an integrated circuit structure, the method comprising:

depositing a conductive layer above an insulating material;

patterning the conductive layer to form a plurality of first metal features and at least one second metal feature, wherein
the first metal features and the at least one second metal feature have a substantially equal thickness, $T_{met}$, above the insulating material, and
the first metal features have a substantially standard distance, $S_{met}$, between parallel edges of adjacent ones of the first metal features, and
the at least one second metal feature is connected to one or more of the first metal features in proximity to an intersection area of the conductive layer,
wherein an intersection area is a roughly rectangular area that includes at least one metal feature corner, parts of at least one other metal feature that are in close proximity to the at least one metal feature corner, and a portion of a dielectric layer that will be located between the at least one metal feature corner and the parts of the at least one other metal feature, and wherein the intersection area includes the parts of the at least one other metal feature that are within a distance of roughly $\sqrt{2}*S_{met}$ from the at least one metal feature corner; and depositing the dielectric layer having a thickness, $T_{IDL}$, over the conductive layer.

18. The method of claim 17, wherein the intersection area is a two-way intersection, which includes one metal feature corner and a metal feature with an inverted corner, and the at least one second metal feature is connected in proximity to the one metal feature corner.

19. The method of claim 17, wherein the intersection area is a two-way intersection, which includes one metal feature corner and a metal feature with an inverted corner, and the at least one second metal feature is connected in proximity to the inverted corner.

20. The method of claim 17, wherein the intersection area is a three-way intersection, which includes two metal feature corners and a metal feature with straight edge through the intersection area, and the at least one second metal feature is connected in proximity to one or both of the metal feature corners.

21. The method of claim 17, wherein the intersection area is a three-way intersection, which includes two metal feature corners and a metal feature with straight edge through the intersection area, and the at least one second metal feature is connected to the straight edge.

22. The method of claim 17, wherein the intersection area is a four-way intersection, which includes four metal feature corners, and the at least one second metal feature is connected in proximity to at least one of the four metal feature corners.

23. The method of claim 17, wherein patterning the conductive layer comprises patterning the conductive layer so that at least one four-way intersection is converted to two three-way intersections by shifting two or more of the first metal features that originally existed within the at least one four-way intersection.

24. The method of claim 17, wherein an altitude of the dielectric layer above the insulating material roughly equals $T_{met}+T_{IDL}$ over a metal feature, and the at least one second metal feature maintains an altitude of a portion of the dielectric layer that overlies the intersection area to roughly $T_{met}+T_{IDL}$.

25. The method of claim 17, wherein a top surface of the dielectric layer is substantially self-planarized upon depositing the dielectric layer.

26. The method of claim 17, wherein the method proceeds in the order presented.

27. A method for fabricating an integrated circuit structure, the method comprising:

depositing a conductive layer above an insulating material;

patterning the conductive layer to form a plurality of first metal features and at least one second metal feature, wherein
the first metal features and the at least one second metal feature have a substantially equal thickness, $T_{met}$, above the insulating material, and
the first metal features have a substantially standard distance, $S_{met}$, between parallel edges of adjacent ones of the first metal features, and
the at least one second metal feature is connected to one or more of the first metal features in proximity to an intersection area of the conductive layer,
wherein an intersection area is a roughly rectangular area that includes at least one metal feature corner, parts of at least one other metal feature that are in close proximity to the at least one metal feature corner, and a portion of a dielectric layer that will be located between the at least one metal feature corner and the parts of the at least one other metal feature; and depositing the dielectric layer over the conductive layer, wherein the dielectric layer has a thickness, $T_{IDL}$, where $0.5*S_{met} \leq T_{IDL} \leq (\sqrt{2}/2)*S_{met}$.

28. The method of claim 27, wherein depositing the dielectric layer comprises depositing a dielectric layer where $T_{IDL}$ approximately equals $0.5*S_{met}$.

29. The method of claim 27, wherein depositing the dielectric layer comprises depositing a dielectric layer where $0.5*S_{met} \leq T_{IDL} \leq 0.6*S_{met}$.

30. The method of claim 27, wherein an altitude of the dielectric layer above the insulating material roughly equals $T_{met}+T_{IDL}$ over a metal feature, and the at least one second metal feature maintains an altitude of a portion of the dielectric layer that overlies the intersection area to roughly $T_{met}+T_{IDL}$.

31. The method of claim 27, wherein a top surface of the dielectric layer is substantially self-planarized upon depositing the dielectric layer.

32. The method of claim 27, wherein the method proceeds in the order presented.

* * * * *

UNITED STATES PATENT AND TRADEMARK OFFICE
CERTIFICATE OF CORRECTION

PATENT NO. : 6,737,346 B2
DATED : May 18, 2004
INVENTOR(S) : Ireland

It is certified that error appears in the above-identified patent and that said Letters Patent is hereby corrected as shown below:

Column 1,
Line 19, delete "arc" and insert -- are --, therefor.
Line 24, after "($T_{IDL}$)" and insert -- . --, therefor.

Column 2,
Line 21, delete "Wemer" and insert -- Werner --, therefor.

Column 3,
Lines 28 and 30, delete "$S_{metdrag}$" and insert -- $S_{metdiag}$ --, therefor.

Column 4,
Line 4, delete "$0.5*S_{metdrag}$" and insert -- $0.5*S_{metdiag}$ --, therefor.
Line 5, delete "$S_{metdrag}$" and insert -- $S_{metdiag}$ --, therefor.
Line 19, delete "arc" and insert -- are --, therefor.

Column 8,
Lines 60 and 62, delete "$S_{metdrag}$" and insert -- $S_{metdiag}$ --, therefor.

Column 11,
Line 24, delete "attitude" and insert -- altitude --, therefor.
Line 44, delete "arc" and insert -- are --, therefor.

Column 14,
Line 64, delete "arc" and insert -- are --, therefor.

Column 16,
Line 35, delete "alterative" and insert -- alternative --, therefor.

Column 18,
Line 16, delete "," and insert -- ; --, therefor.

UNITED STATES PATENT AND TRADEMARK OFFICE
CERTIFICATE OF CORRECTION

PATENT NO. : 6,737,346 B2
DATED : May 18, 2004
INVENTOR(S) : Ireland

It is certified that error appears in the above-identified patent and that said Letters Patent is hereby corrected as shown below:

<u>Column 22,</u>
Line 49, delete "$0.5*S_{met} \leq T_{IDL} \leq (\sqrt{2}/2)*S_{met}$" and insert -- $0.5*S_{met} = T_{IDL} = (\sqrt{2}/2)*S_{met}$ --, therefor.

Line 55, delete "$0.5*S_{met} \leq T_{IDL} \leq 0.6*S_{met}$" and insert -- $0.5*S_{met} = T_{IDL} = 0.6*S_{met}$ --, therefor.

Signed and Sealed this

Twenty-first day of December, 2004

JON W. DUDAS
*Director of the United States Patent and Trademark Office*